United States Patent
Chen et al.

(10) Patent No.: US 11,301,067 B2
(45) Date of Patent: Apr. 12, 2022

(54) TOUCH DISPLAY DEVICE

(71) Applicant: InnoLux Corporation, Miao-Li County (TW)

(72) Inventors: Po-Yang Chen, Miao-Li County (TW); Hsing-Yuan Hsu, Miao-Li County (TW); Tzu-Min Yan, Miao-Li County (TW); Chun-Hsien Lin, Miao-Li County (TW); Kuei-Sheng Chang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/840,467

(22) Filed: Apr. 6, 2020

(65) Prior Publication Data
US 2020/0348772 A1 Nov. 5, 2020

(30) Foreign Application Priority Data
Apr. 30, 2019 (CN) .......................... 201910363686.3

(51) Int. Cl.
*G06F 3/041* (2006.01)

(52) U.S. Cl.
CPC .... *G06F 3/041* (2013.01); *G06F 2203/04103* (2013.01)

(58) Field of Classification Search
CPC ........... G06F 3/041; G06F 2203/04103; G06F 3/0443; G06F 3/04166; G06F 3/04164; G06F 3/0412; H01L 27/124
See application file for complete search history.

(56) References Cited

U.S. PATENT DOCUMENTS

| | | | | |
|---|---|---|---|---|
| 2017/0168648 | A1* | 6/2017 | Takahashi | ............. G06F 3/0445 |
| 2017/0221971 | A1* | 8/2017 | Shen | ..................... G06F 3/0445 |
| 2018/0206411 | A1* | 7/2018 | Chen | ..................... H05B 45/20 |
| 2019/0012957 | A1 | 1/2019 | Liu | |
| 2019/0304958 | A1 | 10/2019 | Chen | |

FOREIGN PATENT DOCUMENTS

| | | |
|---|---|---|
| CN | 109062459 A | 12/2018 |
| CN | 109491530 A | 3/2019 |
| TW | I653752 B | 3/2019 |

* cited by examiner

*Primary Examiner* — Mark W Regn
(74) *Attorney, Agent, or Firm* — Winston Hsu

(57) ABSTRACT

A touch display device is provided in this disclosure. The touch display device includes a substrate, a first conductive layer, a second conductive layer, a stacked structure, an inorganic light emitting unit, and a touch sensing circuit. The first conductive layer is disposed on the substrate. The first conductive layer includes a gate electrode. The second conductive layer is disposed on the first conductive layer. The second conductive layer includes a source electrode and a drain electrode. The stacked structure is disposed on the substrate. The staked structure includes a conductive channel and a sensing electrode. The inorganic light emitting unit is disposed on the stacked structure. The inorganic light emitting unit is electrically connected with the drain electrode via the conductive channel. The touch sensing circuit is electrically connected with the sensing electrode.

2 Claims, 22 Drawing Sheets

TOUCH DISPLAY DEVICE

BACKGROUND OF THE DISCLOSURE

1. Field of the Disclosure

The present disclosure relates to a touch display device, and more particularly, to an in-cell type touch display device.

2. Description of the Prior Art

The overall thickness of the touch display device with a touch display panel, such as an out-cell touch display panel, will be increased because the touch sensing units are formed on an independent touch panel. Therefore, there is still a need to reduce the overall thickness of the touch display device.

SUMMARY OF THE DISCLOSURE

One of the objectives of the present disclosure is to provide a touch display device. Parts with touch sensing functions are integrated into a self-luminant display device. The purposes of thickness reduction, process integration, and/or production cost reduction may be achieved accordingly.

A touch display device is provided in an embodiment of the present disclosure. The touch display device includes a substrate, a first conductive layer, a second conductive layer, a stacked structure, an inorganic light emitting unit, and a touch sensing circuit. The first conductive layer is disposed on the substrate. The first conductive layer includes a gate electrode. The second conductive layer is disposed on the first conductive layer. The second conductive layer includes a source electrode and a drain electrode. The stacked structure is disposed on the substrate. The staked structure includes a conductive channel and a sensing electrode. The inorganic light emitting unit is disposed on the stacked structure. The inorganic light emitting unit is electrically connected with the drain electrode via the conductive channel. The touch sensing circuit is electrically connected with the sensing electrode.

These and other objectives of the present disclosure will no doubt become obvious to those of ordinary skill in the art after reading the following detailed description of the embodiment that is illustrated in the various figures and drawings.

DETAILED DESCRIPTION

Certain terms are used throughout the description and following claims to refer to particular components. As one skilled in the art will understand, equipment manufacturers may refer to a component by different names. This document does not intend to distinguish between components that differ in names but not function. In the following description and in the claims, the terms "have", "include" and "comprise" are used in an open-ended fashion, and thus should be interpreted to mean "include, but not limited to . . . ".

It will be understood that when an element or layer is referred to as being "on" or "connected with" another element or layer, it can be directly on or directly connected with another element or layer, or intervening elements or layers may be presented therebetween. In contrast, when an element is referred to as being "directly on" or "directly connected with" another element or layer, there are no intervening elements or layers presented.

The ordinal numbers, such as "first", "second", etc., used in the description and the claims are used to modify the elements in the claims and do not themselves imply and represent that the claim has any previous ordinal number, do not represent the sequence of the claimed elements, and do not represent the sequence of the manufacturing methods. These ordinal numbers are only used to make a claimed element with a certain name clear from another claimed element with the same name.

In this disclosure, the terms, such as "about", "around", "roughly", "approximately", "practically", and "substantially", are usually expressed within a range of 20%, or within a range of 10%, or within a range of 5%, or within a range of 3%, or within a range of 2%, or within a range of 1%, or within a range of 0.5% of a given value. The given amount is a roughly amount. That is, in the absence of specific descriptions of "about", "around", "roughly", "approximately", "practically", and "substantially", it can still be implied such as "about", "around", "roughly", "approximately", "practically", and "substantially".

It should be understood that embodiments are described below to illustrate different technical features, but these technical features may be mixed to be used or combined with one another in different ways without conflicting with one another.

Figure 1:
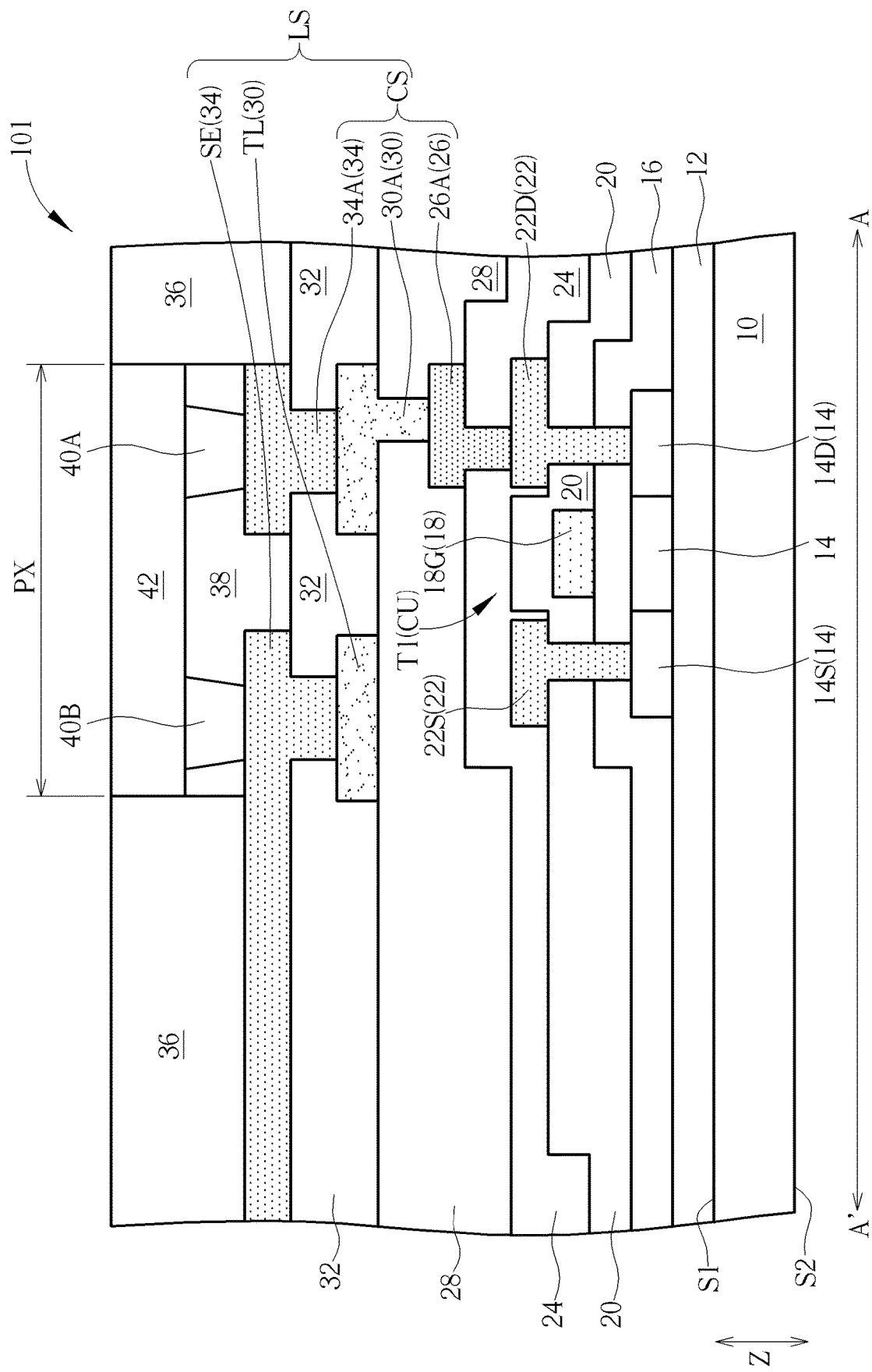
FIG. 1 is a schematic diagram illustrating a partial cross-sectional structure of a touch display device according to a first embodiment of the present disclosure.
Figure 2:
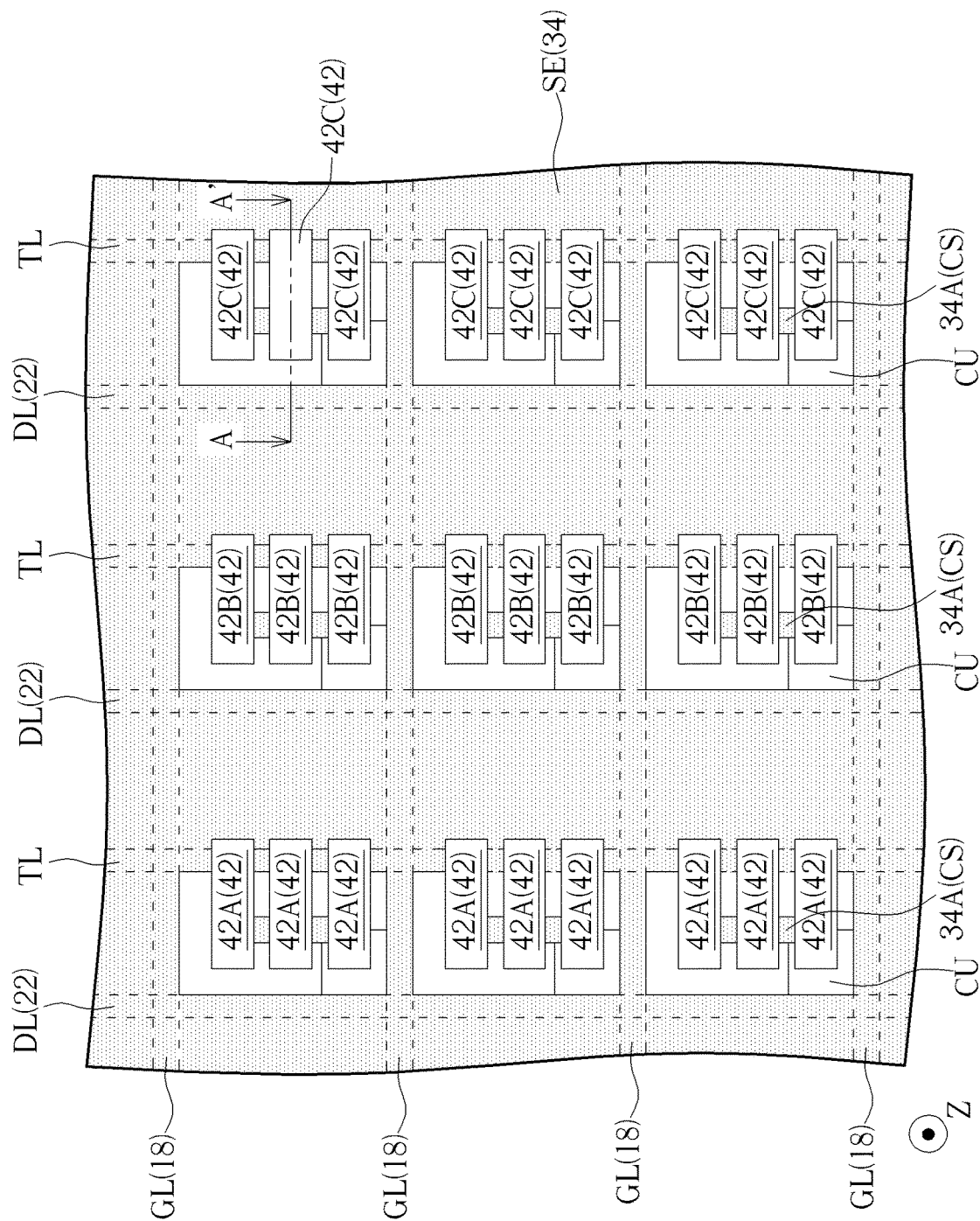
FIG. 2 is a schematic diagram illustrating a top view of the touch display device according to the first embodiment of the present disclosure.
Figure 3:
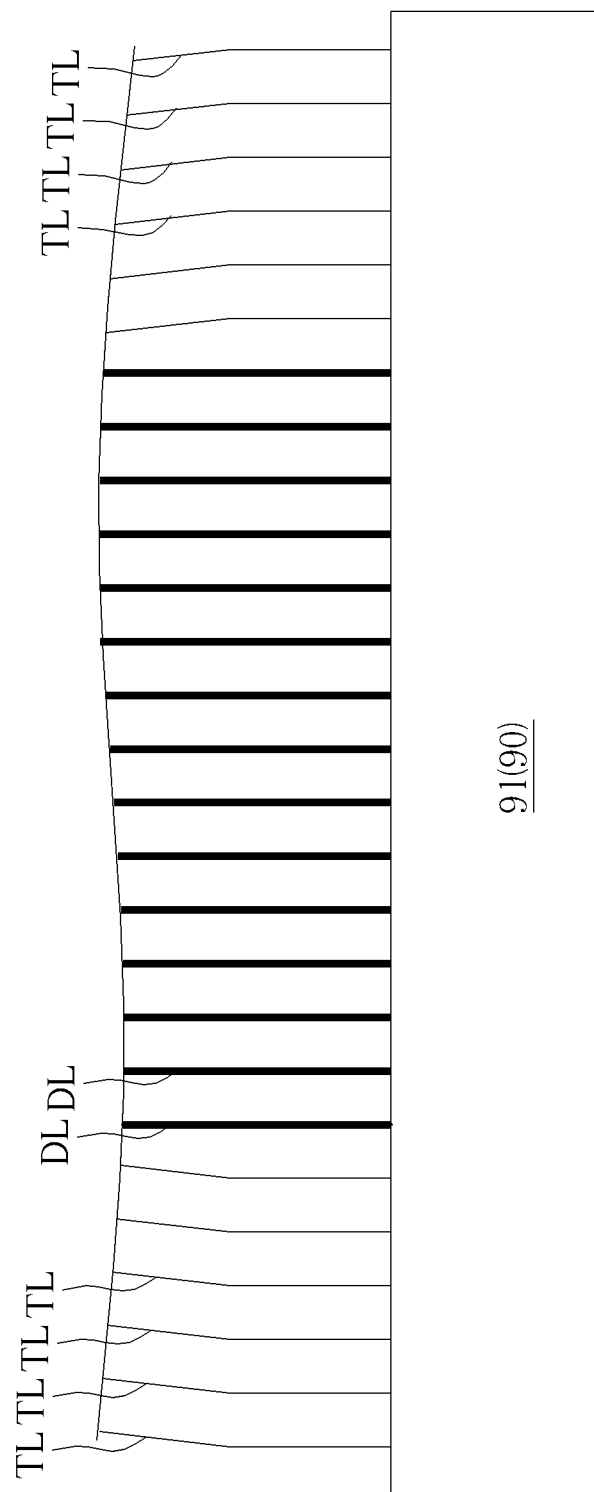
FIG. 3 is a schematic diagram illustrating allocations of a touch sensing circuit and sensing lines in the touch display device according to the first embodiment of the present disclosure.
Figure 4:
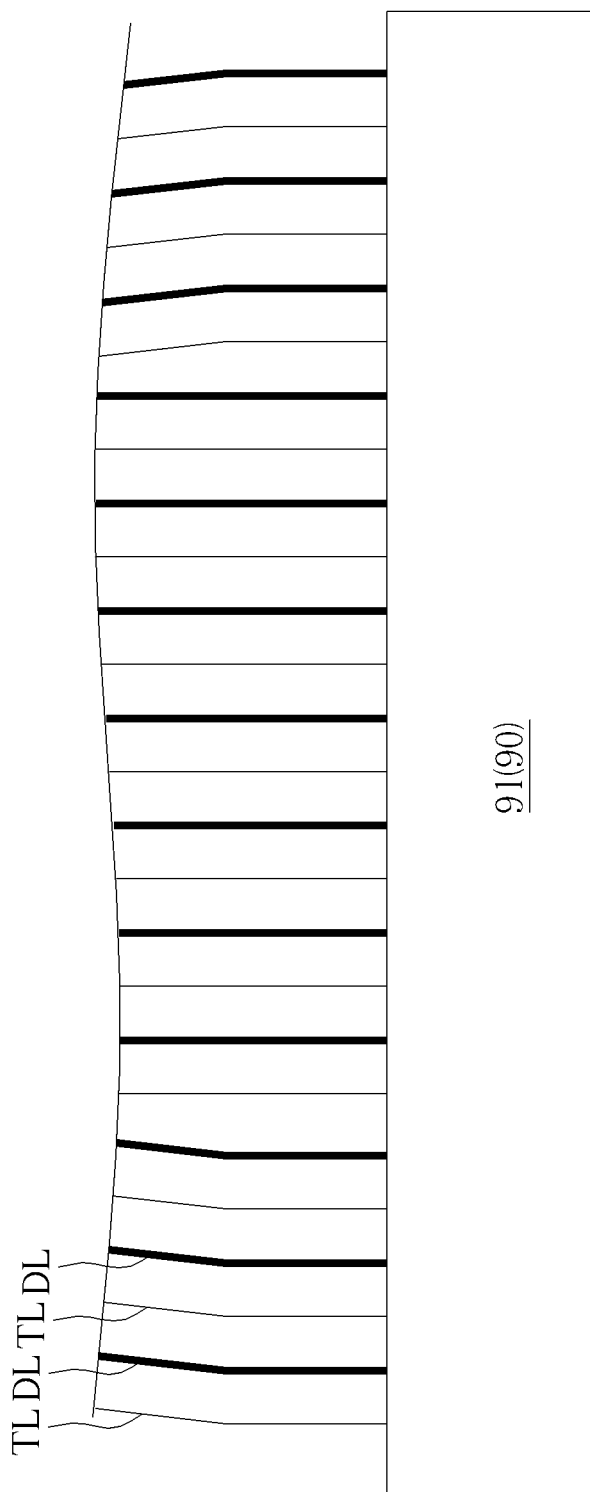
FIG. 4 is a schematic diagram illustrating allocations of a touch sensing circuit and sensing lines in the touch display device according to another embodiment of the present disclosure.
Figure 5:
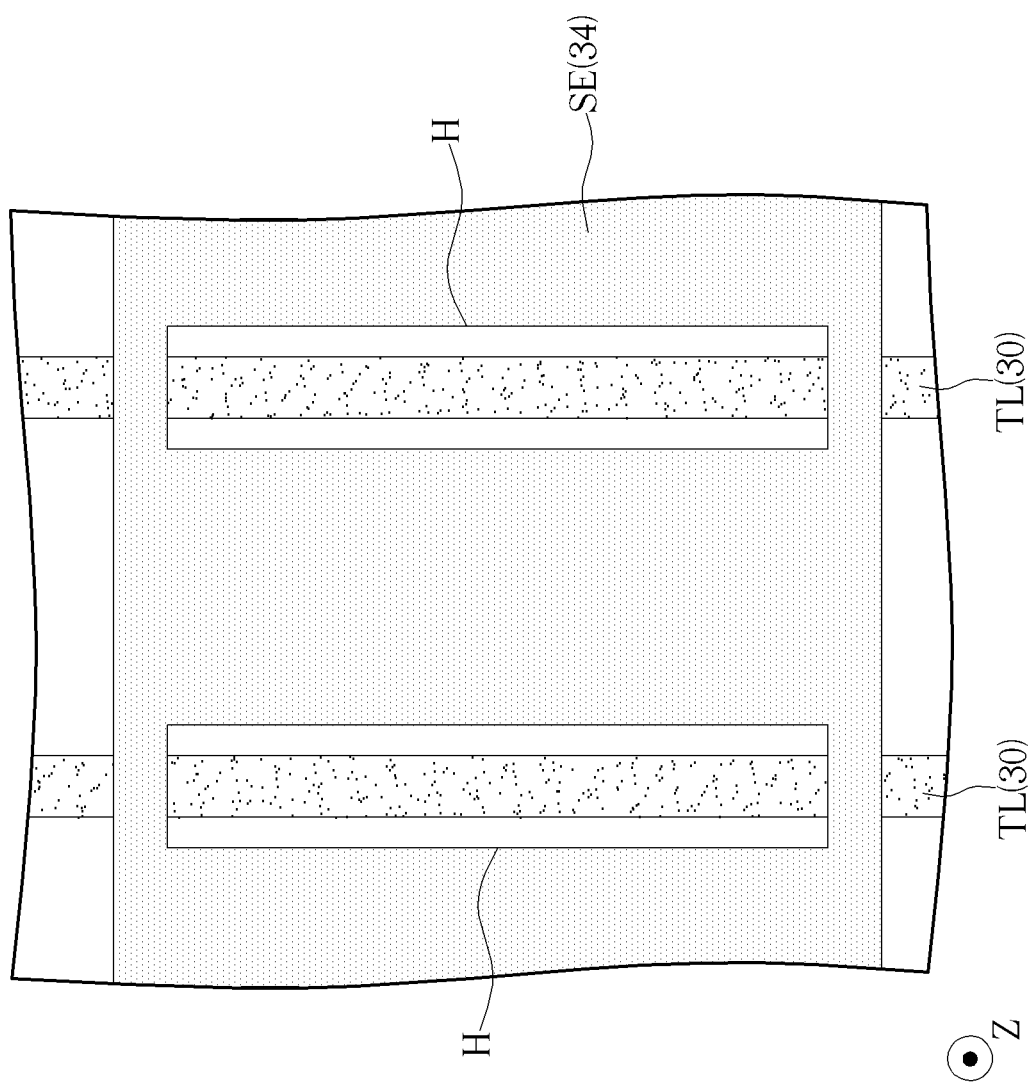
FIG. 5 is a schematic diagram illustrating partial allocations of sensing electrodes and sensing lines in the touch display device according to another embodiment of the present disclosure.

Please refer to FIGS. 1-5. FIG. 2 is a schematic diagram illustrating a top view of a touch display device in this embodiment, FIG. 1 is a schematic diagram illustrating a partial cross-sectional structure taken along a cross-sectional line A-A' in FIG. 2 according to this embodiment, FIG. 3 is a schematic diagram illustrating allocations of a touch sensing circuit and sensing lines in the touch display device according to this embodiment, FIG. 4 is a schematic diagram illustrating allocations of a touch sensing circuit and sensing lines in the touch display device according to another embodiment of the present disclosure, and FIG. 5 is a schematic diagram illustrating partial allocations of sensing electrodes and the sensing lines in the touch display device according to this embodiment. As shown in FIGS. 1-3, a touch display device 101 is provided in this embodiment. The touch display device 101 includes a substrate 10, a first conductive layer 18, a second conductive layer 22, a stacked structure LS, and an inorganic light emitting unit 42. The first conductive layer 18 is disposed on the substrate 10, and the first conductive layer 18 includes a gate electrode 18G The second conductive layer 22 is disposed on the first conductive layer 18, and the second conductive layer 22 includes a source electrode 22S and a drain electrode 22D, but the location where the second conductive layer 22 is disposed is not limited to the location shown in FIG. 1. In some embodiments, the electrode 22S may be a drain electrode, and the electrode 22D may be a source electrode. The stacked structure LS is disposed on the substrate 10, and the staked structure LS includes a conductive channel CS and a sensing electrode SE. The inorganic light emitting unit 42 is disposed on the stacked structure LS, and the inorganic light emitting unit 42 is electrically connected with the drain electrode 22D via the conductive channel CS.

The substrate 10 may have two opposite sides (such as a first side S1 and a second side S2 shown in FIG. 1) in a thickness direction Z (i.e. the normal direction of the substrate 10), and each part in the touch display device may be disposed on and/or near the first side S1 or the second side S2 of the substrate 10 according to the demands. In some embodiments, the touch display device 101 may further include a semiconductor layer 14 and a gate dielectric layer 16 disposed on and/or near the first side S1 of the substrate 10, and the semiconductor layer 14, the gate dielectric layer 16, the gate electrode 18Q the source electrode 22S, and the drain electrode 22D may constitute a thin film transistor (such as a first transistor T1 shown in FIG. 1), but not limited thereto. In some embodiments, a buffer layer 12 may be formed on and/or near the first side S1 of the substrate 10 before the step of forming the semiconductor layer 14, and the semiconductor layer 14 may be formed on the buffer layer 12. Subsequently, the gate dielectric layer 16 may be formed on the semiconductor layer 14, and the first conductive layer 18 may be formed on the gate dielectric layer 16. A first dielectric layer 20 may then be formed to cover at least a part of the gate dielectric layer 16 and at least a part of the first conductive layer 18, and at least a part of the second conductive layer 22 may be formed on the first dielectric layer 20, but not limited thereto. In some embodiments, a source doped region 14S and a drain doped region 14D may be formed in the semiconductor layer 14. The source electrode 22S and the drain electrode 22D may be formed on and electrically connected with the source doped region 14S and the drain doped region 14D respectively. For example, after forming the first dielectric layer 20, an opening penetrating the first dielectric layer 20 and the gate dielectric layer 16 above the source doped region 14S and an opening penetrating the first dielectric layer 20 and the gate dielectric layer 16 above the drain doped region 14D may be formed, and the source electrode 22S and the drain electrode 22D may be partly formed in the openings for contacting and being electrically connected with the source doped region 14S and the drain doped region 14D respectively. The first transistor T1 shown in FIG. 1 may be regarded as a top-gate transistor structure, and the first transistor T1 in the present disclosure is not limited to this structure. The first transistor T1 may have other suitable types of transistor structures (such as a bottom-gate transistor structure, a dual-gate transistor structure, a multi-gate transistor structure, etc.), and the manufacturing sequence of the first conductive layer 18 and the second conductive layer 22, and the relative dispositions of the gate electrode 18G the source electrode 22S, and the drain electrode 22D may be modified accordingly.

As shown in FIG. 1 and FIG. 2, in some embodiments, the first transistor T1 may be at least a part of a control unit CU corresponding to the inorganic light emitting unit 42. For example, the control unit CU may be a 2T1C (two transistors and one capacitor) structure, a 3T1C (three transistors and one capacitor) structure, or other suitable circuit compositions including a transistor. The touch display device 101 may include a plurality of the control units CU arranged in an array configuration, and each of the control units CU may be disposed corresponding to one or more inorganic light emitting units 42, but not limited thereto. In some embodiments, the inorganic light emitting units 42 may include a first inorganic light emitting unit 42A, a second inorganic light emitting unit 42B, and a third inorganic light emitting unit 42C configured to emit light of different colors (such as red light, green light, and blue light) respectively, but not limited thereto. Additionally, the touch display device 101 may include a plurality of gate lines GL, a plurality of data lines DL disposed crossing one another, and each of the control units CU may be electrically connected with the gate line GL and the data line DL corresponding to the control unit CU. In some embodiments, the gate lines GL and the gate electrode 18G may be formed of an identical conductive layer (such as the first conductive layer 18), and the data lines DL, the source electrode 22S, and the drain electrode 22D may be formed of another identical conductive layer (such as the second conductive layer), but not limited thereto.

In the touch display device 101, the stacked structure LS including the conductive channel CS and the sensing electrode SE may be disposed on and/or near the first side S1 of the substrate 10, but the present disclosure is not limited to this. In some embodiments, the stacked structure LS may be disposed on and/or near the second side S2 of the substrate 10 according to some demands, or the stacked structure LS may be partly disposed on and/or near the first side S1 of the substrate 10 and partly disposed on and/or near the second side S2 of the substrate 10 according to some demands. In some embodiments, the touch display device 101 may further include a second dielectric layer 24 covering the first transistor T1, and at least a part of the stacked structure LS may be disposed on the second dielectric layer 24. For example, the conductive channel CS may include a first portion 26A of a third conductive layer 26, a first portion 30A of a fourth conductive layer 30, and a first portion 34A of a fifth conductive layer 34 stacked in the thickness direction Z of the substrate 10 and electrically connected with one another, but not limited thereto. In other words, the conductive channel CS may include a multi-layer stacked structure. For example, the conductive channel CS may include a first layer (such as the first portion 30A of the fourth conductive layer 30 described above) and a second layer (such as the first portion 34A of the fifth conductive layer 34 described above). The second layer is disposed on the first layer, and the sensing electrode SE and one of the first layer or the second layer may be formed of the identical layer. For example, the sensing electrode SE may be formed of another portion of the fifth conductive layer 34, and the sensing electrode SE and the first portion 34A of the fifth conductive layer 34 in the conductive channel CS may be formed of the identical layer accordingly. In addition, the touch display device 101 may further include a sensing line TL disposed under the sensing electrode SE, and the sensing line TL is electrically connected with the sensing electrode SE. In some embodiments, the sensing line TL may be formed of another portion of the fourth conductive layer 30, but not limited thereto.

Specifically, in some embodiments, the first portion 26A of the third conductive layer 26 may be partly disposed on the second dielectric layer 24 and partly disposed in an opening penetrating the second dielectric layer 24 for being electrically connected with the drain electrode 22D. The first portion 30A of the fourth conductive layer 30 may be partly disposed on a planarization layer 28 and partly disposed in an opening penetrating the planarization layer 28 for being electrically connected with the first portion 26A of the third conductive layer 26, and the sensing line TL may be disposed on the planarization layer 28. The first portion 34A of the fifth conductive layer 34 may be partly disposed on a third dielectric layer 32 and partly disposed in an opening penetrating the third dielectric layer 32 for being electrically connected with the first portion 30A of the fourth conductive layer 30, and the sensing electrode SE may be disposed on the third dielectric layer 32. In some embodiments, the touch display device 101 may further include a pixel defining layer (PDL) 36 disposed on the third dielectric layer 32 for defining a plurality of pixel regions PX, and each of the inorganic light emitting units 42 may be disposed in the corresponding pixel region, but not limited thereto. Specifically, in some embodiments, the touch display device 101 may further include a fourth dielectric layer 38 disposed on the pixel regions described above and disposed between the inorganic light emitting unit 42 and the conductive channel CS, and a first contact pad 40A may be disposed in the fourth dielectric layer 38 for electrically connecting the conductive channel CS and the inorganic light emitting unit 42. Additionally, in some embodiments, the sensing electrode SE may be electrically connected with the inorganic light emitting unit 42. For example, the sensing electrode SE may be electrically connected with the inorganic light emitting unit 42 via a second contact pad 40B disposed in the fourth dielectric layer 38, and the first contact pad 40A and the second contact pad 40B may include and be formed of the same conductive material, but not limited thereto. In some embodiments, the first contact pad 40A may include a conductive material different from a conductive material of the second contact pad 40B.

In some embodiments, the substrate 10 may be a rigid substrate or a flexible substrate, and the material of the substrate 10 may include a glass substrate, a plastic substrate, a ceramic substrate, polyimide (PI), polyethylene terephthalate (PET), other suitable materials, or a substrate made of a combination of the materials described above. The buffer layer 12 may be a single layer or multiple layers of dielectric materials, such as silicon oxide, silicon nitride, silicon oxynitride, etc., but not limited thereto. The semiconductor layer 14 may include a semiconductor material containing silicon (such as polysilicon, single crystal silicon, etc.), an oxide semiconductor material (such as indium gallium zinc oxide, zinc oxide, etc.), or other suitable types of semiconductor materials. The gate dielectric layer 16 may include silicon oxide, silicon nitride, silicon oxynitride, aluminum oxide, hafnium oxide, or other suitable dielectric materials. The first conductive layer 18, the second conductive layer 22, the third conductive layer 26, the fourth conductive layer 30, the fifth conductive layer 34, the first contact pad 40A, and the second contact pad 40B may respectively include a metallic conductive material, a transparent conductive material, other suitable types of conductive materials, or a combination of the materials described above. For example, the metallic conductive material described above may include at least one of aluminum, copper, silver, chromium, titanium, or molybdenum, a composite layer of the materials described above, an alloy of the materials described above, and the transparent conductive material described above may include indium tin oxide, indium zinc oxide, or aluminum zinc oxide, but not limited thereto. The first dielectric layer 20, the second dielectric layer 24, and the third dielectric layer 32 may respectively include a single layer or multiple layers of dielectric materials, such as silicon oxide, silicon nitride, silicon oxynitride, etc., but not limited thereto. The planarization layer 28 and the pixel defining layer 36 may respectively include an organic dielectric material, such as acrylic resin and siloxane resin, other suitable dielectric materials, or a combination of the materials described above. The fourth dielectric layer 38 may include an optical clear adhesive (OCA), an optical clear resin (OCR), or other suitable dielectric materials. The inorganic light emitting unit 42 may include a light emitting diode (LED) unit, such as a mini-LED unit, a micro-LED unit, a quantum dot LED (QD-LED) unit module, other suitable types of inorganic light emitting units, or a combination of the light emitting units described above.

As shown in FIGS. 1-3, in some embodiments, the touch display device 101 may further include a touch sensing circuit 91. The touch sensing circuit 91 is electrically connected with the sensing electrode SE for transmitting signals to the sensing electrode SE and/or receiving signals from the sensing electrode SE. In some embodiments, the touch sensing circuit 91 may be implemented by a chip on glass (COG) approach, a chip on film (COF) approach, or other suitable types of touch sensing circuits. In other words, the touch sensing circuit 91 may be disposed on and/or near the first side S1 of the substrate 10 and/or be disposed on and/or near the second side S2 of the substrate 10 according to some demands, or the touch sensing circuit 91 may be disposed on a flexible circuit board without being disposed on the substrate 10. Additionally, in some embodiments, the touch sensing circuit 91 may be integrated into an integrated circuit 90, and the integrated circuit 91 may be configured to control the touch sensing function and the display function in the touch display device 101, but not limited thereto. For example, the touch sensing circuit 91 integrated in the integrated circuit 90 may be electrically connected with the sensing electrode SE via the sensing line TL, and the integrated circuit 90 may be also electrically connected with the data lines DL described above for controlling the operation condition of the control units CU described above. In some embodiments, the data lines DL may be disposed at the middle position, and the sensing lines TL may be disposed at two sides of the data lines DL, but not limited thereto. For example, the sensing lines TL and the data lines DL may be disposed alternately, as shown in FIG. 4.

As shown in FIG. 1 and FIG. 2, in some embodiments, sizes and ranges of the sensing electrodes SE may be modified according to some design requirements (such as the arrangement and the distribution density), and the sensing electrode SE may partly overlap the data line DL and/or the gate line GL in the thickness direction Z of the substrate 10, but not limited thereto. The sensing electrodes SE may be applied in a touch sensing approach, such as a self-capacitive touch sensing approach, a mutual capacitive touch sensing approach, or other suitable types of touch sensing approaches. Additionally, as shown in FIG. 1, FIG. 2, and FIG. 5, in some embodiments, the sensing electrode SE may include a slit H, and the slit H may overlap at least a part of the sensing line TL in the thickness direction Z of the substrate 10. The area of a region where the sensing line TL overlaps the sensing electrode SE may be reduced by disposing the slit H in the sensing electrode SE, and the loading effect generated by the sensing line TL on the sensing electrode SE may be reduced or the touch sensing operation and/or the display operation may be improved accordingly.

Figure 6:
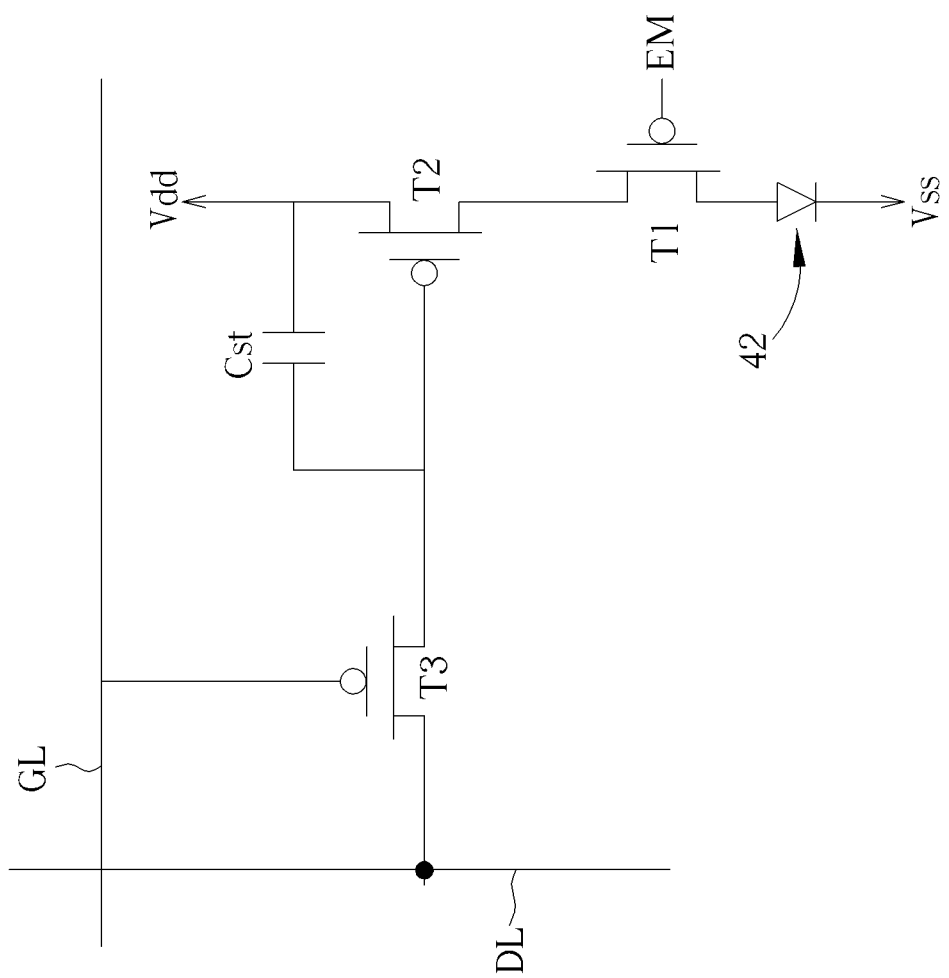
FIG. 6 is a schematic circuit diagram of a control unit in the touch display device according to the first embodiment of the present disclosure.

Please refer to FIG. 6, FIG. 1, and FIG. 2. FIG. 6 is a schematic circuit diagram of the control unit CU in the touch display device 101 according to this embodiment. As shown in FIG. 1, FIG. 2, and FIG. 6, the control unit CU in this embodiment may be a 3T1C structure and include the first transistor aforementioned T1, a second transistor T2, a third transistor T3, and a storage capacitor Cst. A gate electrode of the third transistor T3 may be electrically connected with the gate line GL. A source electrode of the third transistor T3 may be electrically connected with the data line DL. A drain electrode of the third transistor T3 may be electrically connected with a gate electrode of the second transistor T2. An electrode of the second transistor T2 may be connected with a first voltage terminal Vdd, and another electrode of the second transistor T2 may be connected with the source electrode 22S of the first transistor T1. In addition, the drain electrode 22D of the first transistor T1 may be electrically connected with the inorganic light emitting unit 42 (such as being electrically connected with an anode of a light emitting diode in the inorganic light emitting unit 42), the gate electrode 18G of the first transistor T1 may be connected with a control terminal EM, and a cathode of the light emitting diode in the inorganic light emitting unit 42 may be connected with a second voltage terminal Vss. In some embodiments, the first voltage terminal Vdd may be a supply voltage terminal, and the second voltage terminal Vss may be a ground voltage terminal, but not limited thereto. In this embodiment, the control unit CU may be electrically connected with the second voltage terminal Vss via the sensing electrode SE because the sensing electrode SE is electrically connected with the control unit CU, but not limited thereto. In the embodiment shown by FIG. 6, the first transistor T1, the second transistor T2, and the third transistor T3 may be p-type transistors, but the present disclosure is not limited to this. In some embodiments, some of the first transistor T1, the second transistor T2, and the third transistor T3 may be p-type transistor(s), and some of the first transistor T1, the second transistor T2, and the third transistor T3 may be n-type transistor(s). In some embodiments, the first transistor T1, the second transistor T2, and the third transistor T3 may be n-type transistors.

Figure 7:
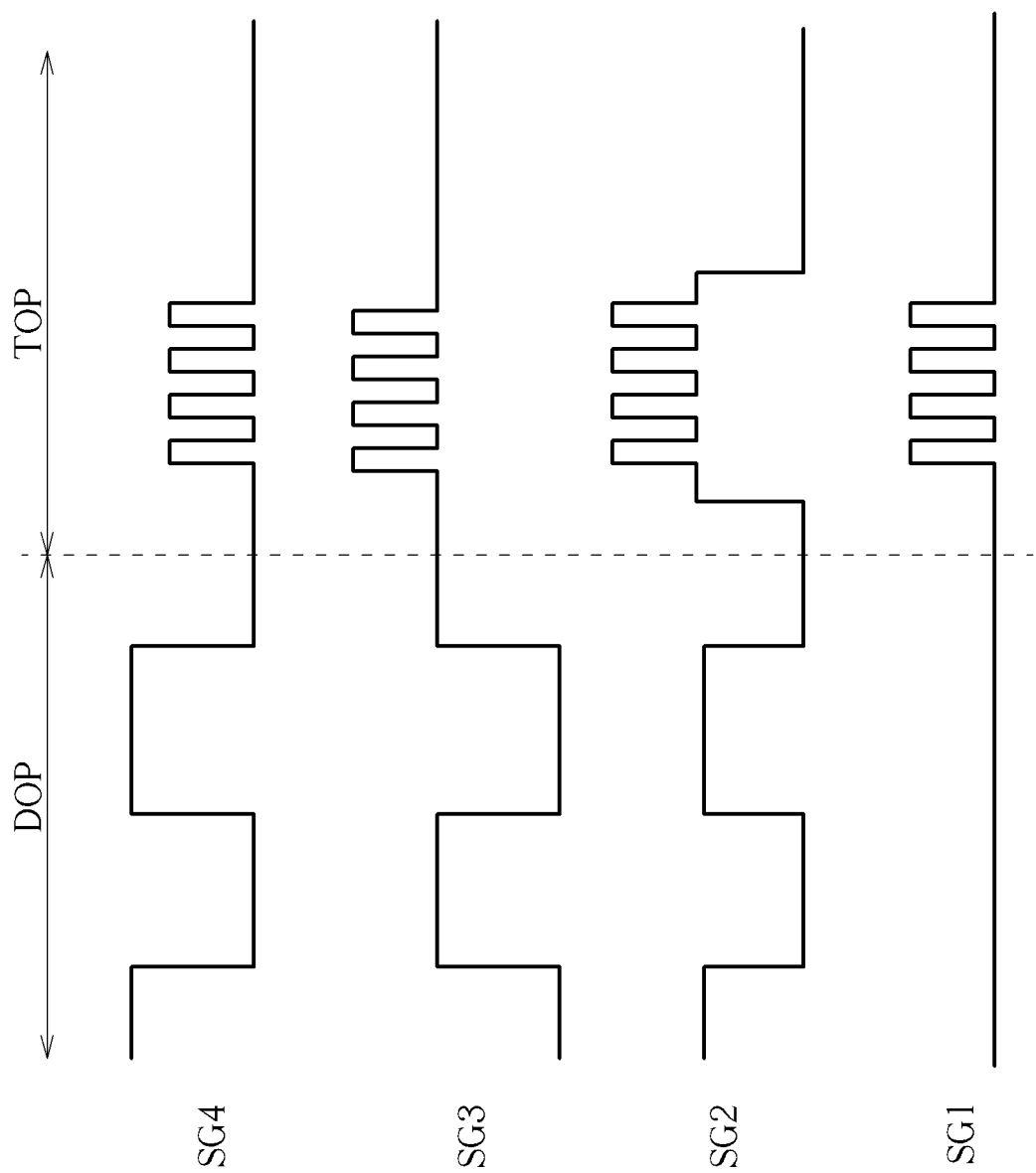
FIG. 7 is a schematic timing diagram of an operation method of a touch display device according to an embodiment of the present disclosure.
Figure 8:
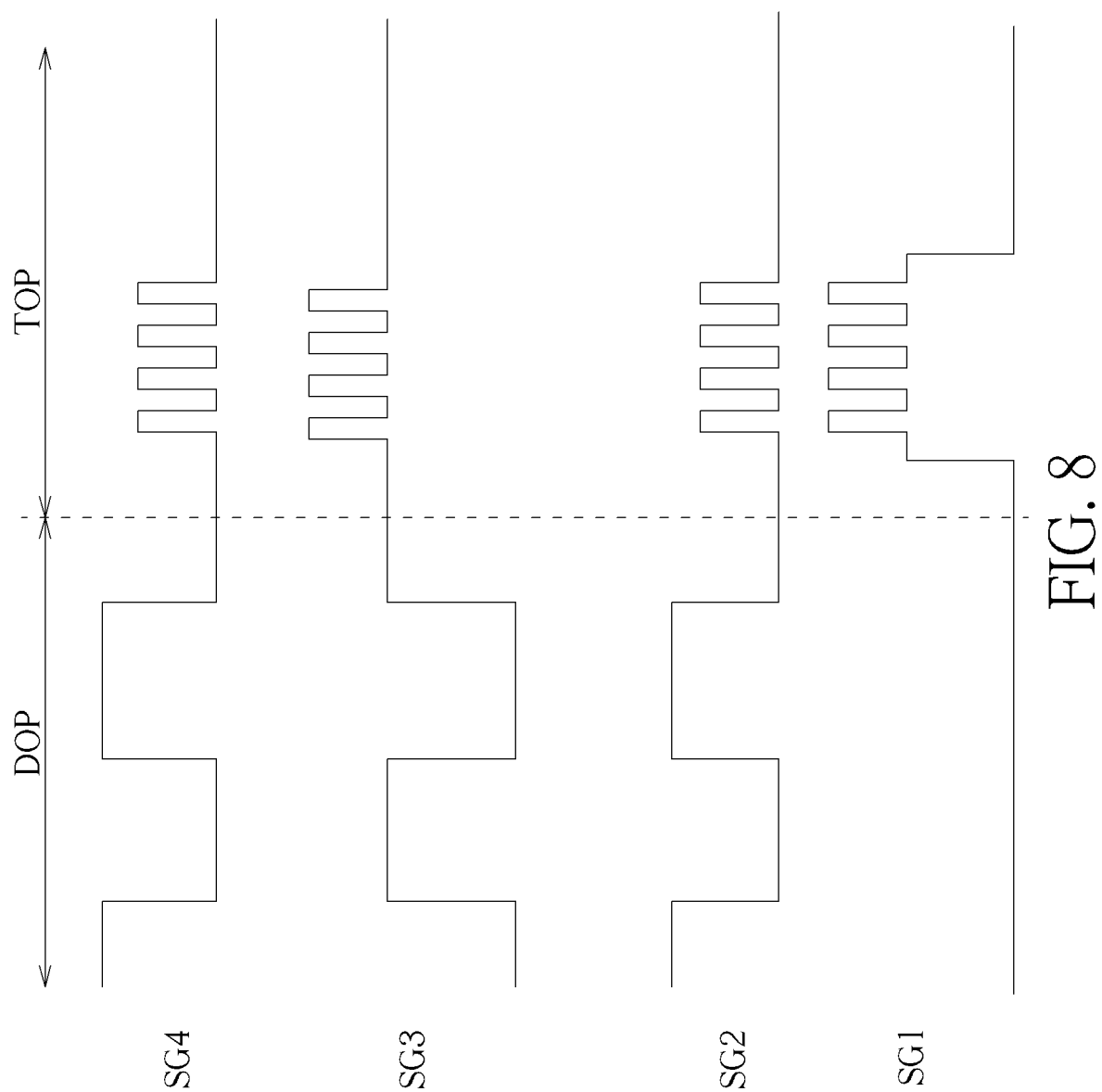
FIG. 8 is a schematic timing diagram of an operation method of a touch display device according to another embodiment of the present disclosure.
Figure 9:
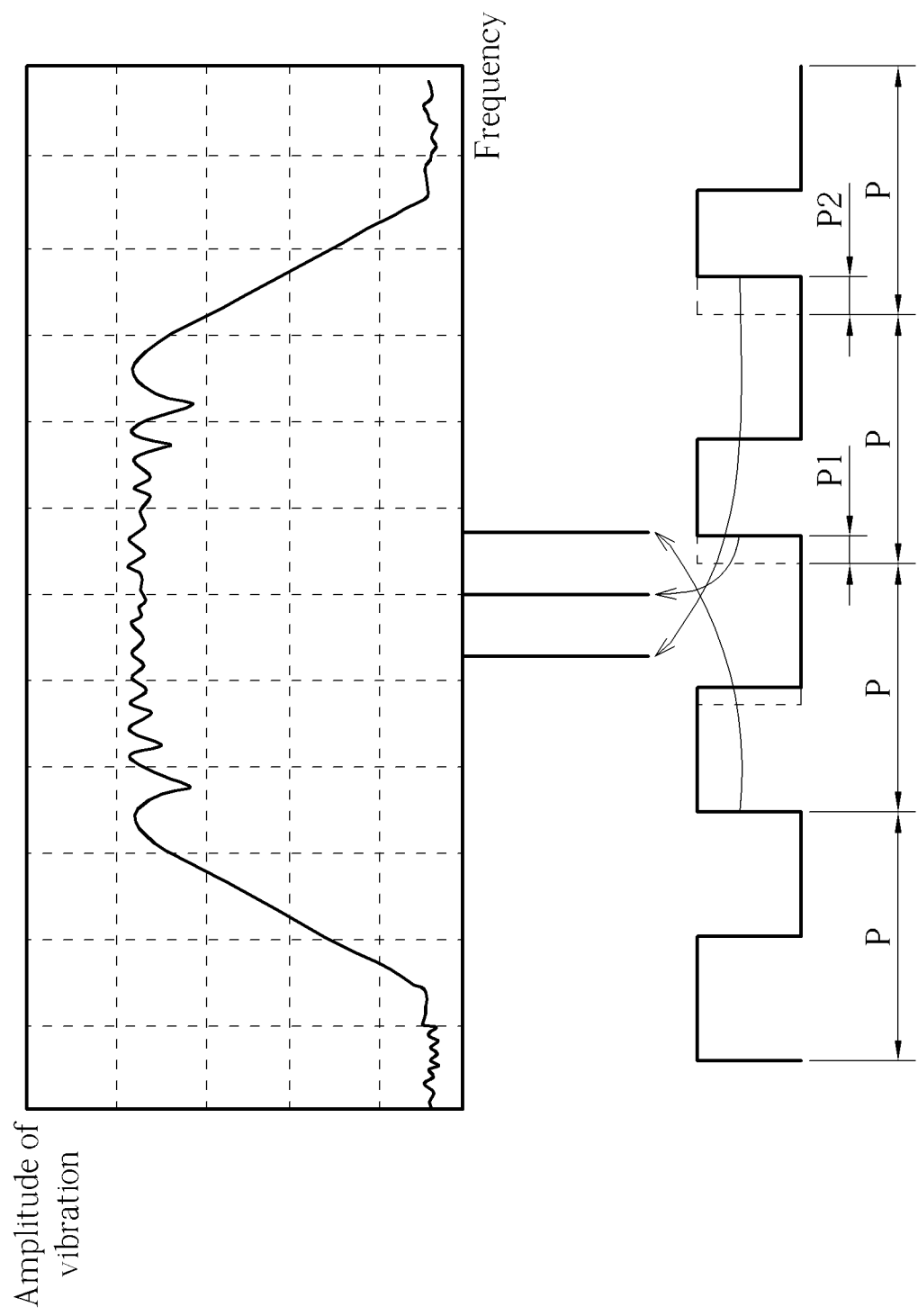
FIG. 9 is a schematic timing diagram of a touch sensing signal in an operation method of a touch display device according to an embodiment of the present disclosure.

When the sensing electrode SE is electrically connected with the second voltage terminal Vss, the touch sensing operation and the display operation of the touch display device 101 may be performed by a time-division approach for reducing mutual interference. For example, please refer to FIGS. 6-9, FIG. 1, and FIG. 2. FIG. 7 is a schematic timing diagram of an operation method of the touch display device 101 according to an embodiment of the present disclosure, FIG. 8 is a schematic timing diagram of an operation method of the touch display device 101 according to another embodiment of the present disclosure, and FIG. 9 is a schematic timing diagram of a touch sensing signal in an operation method of the touch display device 101 according to an embodiment of the present disclosure. As shown in FIGS. 1, 2, 6, and 7, a first signal SG1 is a signal applied to the sensing electrode SE, a second signal SG2 is a signal transmitted from the control terminal EM to the gate electrode 18G of the first transistor T1, a third signal SG3 is a signal transmitted by the gate line GL, and a fourth signal SG4 is a signal transmitted by the data line DL. In some embodiments, the display operation may be performed first (such as a period DOP shown in FIG. 7), the first signal SG1 may remain unchanged during the display operation (such as being electrically connected with the second voltage terminal Vss), and the second signal SG2, the third signal SG3, and the fourth signal SG4 may be signals for the display operation. Subsequently, in performing the touch sensing operation (such as a period TOP shown in FIG. 7), the second signal SG2 may be high electric potential for closing the first transistor T1, and the first signal SG1 under this condition may be a signal for touch sensing without influencing the inorganic light emitting unit 42. As shown in FIG. 1, FIG. 2, FIG. 6, and FIG. 8, in some embodiments, during the touch sensing operation (such as the period TOP shown in FIG. 8), the voltage may be pulled up by the second voltage terminal Vss connected with the first signal SG1 for turning off the inorganic light emitting unit 42, and the first signal SG1 under this condition may be a signal for touch sensing without influencing the condition of the inorganic light emitting unit 42. In some embodiments, the frequency of the touch sensing signal may be changed gradually (the frequency may be increased gradually or decreased gradually) to achieve a spread spectrum effect or to reduce the interference influence generated by the touch sensing signal. For example, a period of a portion of the touch sensing signal may be time P, a period of another portion of the touch sensing signal may be the sum of the time P and time P1, a period of further another portion of the touch sensing signal may be the sum of the time P and time P2, and the time P2 is greater than the time P1 for gradually decreasing the frequency, but not limited thereto. Additionally, in some embodiments, the waveform of the touch sensing signal may include a trapezoid wave, a triangle wave, a sine wave, etc., for increasing length of the pull-up period and/or the pull-down period of the touch sensing signal or reducing the harmonic noise at high frequency, but not limited thereto.

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 10:
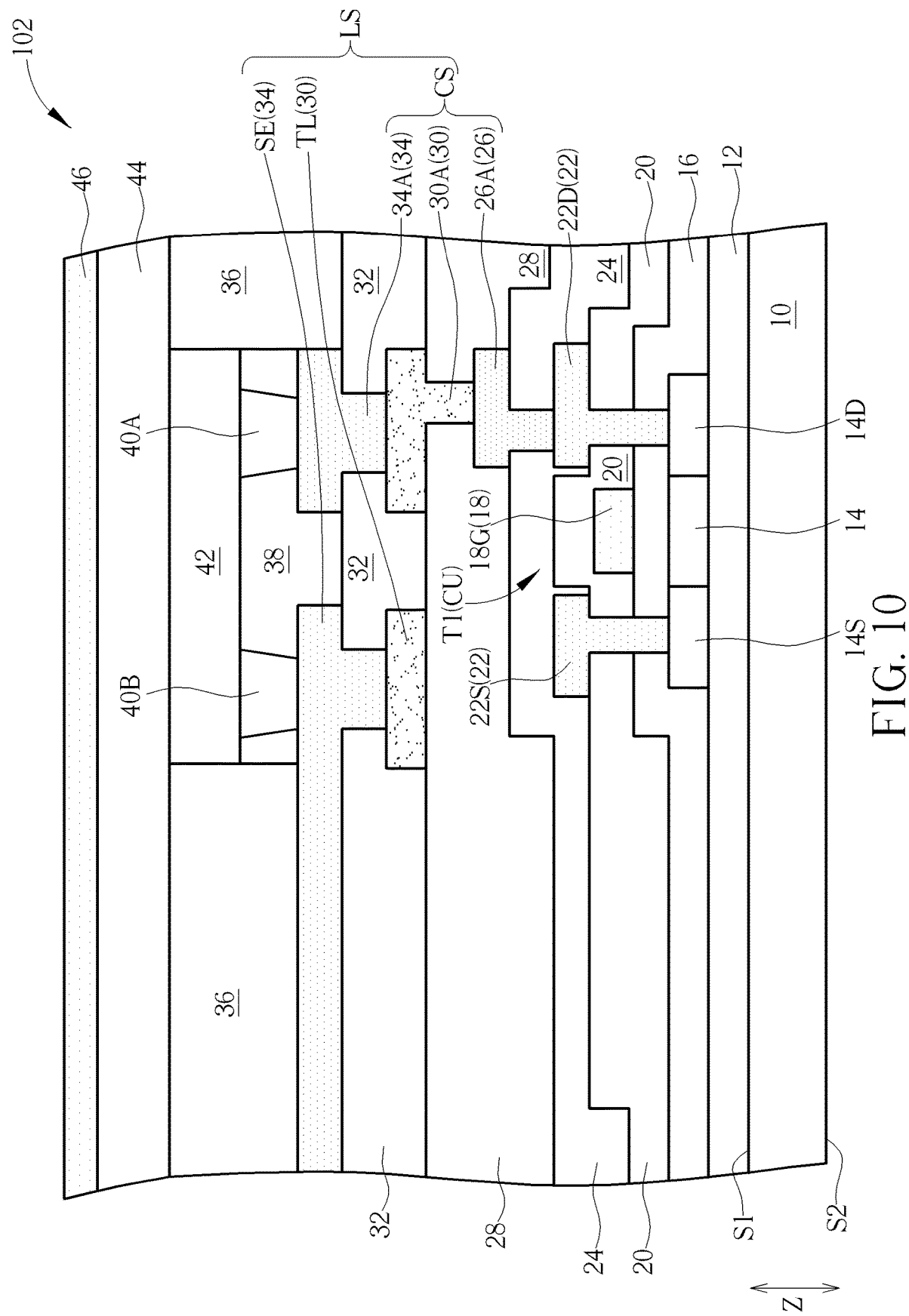
FIG. 10 is a schematic diagram illustrating a partial cross-sectional structure of a touch display device according to a second embodiment of the present disclosure.
Figure 11:
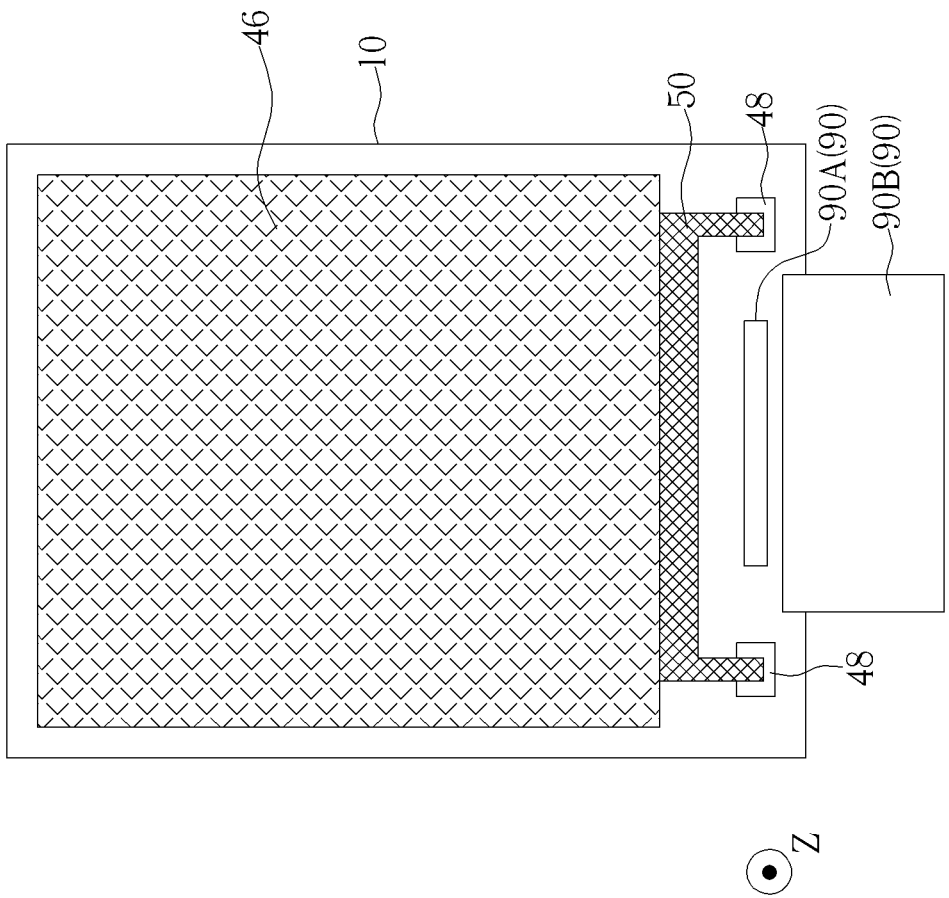
FIG. 11 is a schematic diagram illustrating a top view of the touch display device according to the second embodiment of the present disclosure.
Figure 12:
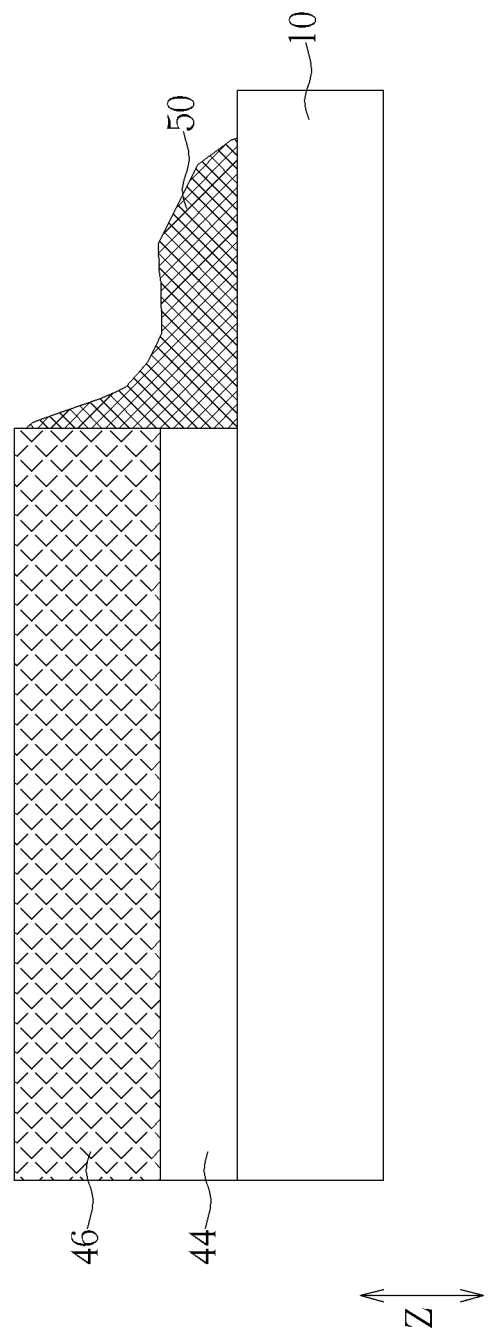
FIG. 12 is a schematic diagram illustrating a partial cross-sectional structure of the touch display device according to the second embodiment of the present disclosure.

Please refer to FIGS. 10-12. FIG. 10 is a schematic diagram illustrating a partial cross-sectional structure of a touch display device 102 according to a second embodiment of the present disclosure, FIG. 11 is a schematic diagram illustrating a top view of the touch display device 102 according to this embodiment, and FIG. 12 is a schematic diagram illustrating a partial cross-sectional structure of the touch display device 101 according to this embodiment. As shown in FIGS. 10-12, in comparison with the embodiment shown in FIG. 1, the touch display device 102 in this embodiment may further include a fifth dielectric layer 44, an electrostatic discharge layer 46, and a conductive layer 50. The electrostatic discharge layer 46 may be disposed on the inorganic light emitting unit 42, and the fifth dielectric layer 44 may be disposed between the electrostatic discharge layer 46 and the inorganic light emitting unit 42. The conductive layer 50 may be disposed on the substrate 10, and the electrostatic discharge layer 46 may be electrically connected with a ground terminal (such as a ground pad 48 shown in FIG. 11) via the conductive layer 50, but not limited thereto. Additionally, a sheet resistance of the electrostatic discharge layer 46 may range from $10^8$ Ω/square to $10^{11}$ Ω/square for reducing the influence on the touch sensing operation, but not limited thereto. In some embodiments, the fifth dielectric layer 44 may include OCA, OCR, or other suitable transparent dielectric materials. The conductive layer 50 may include an electrically conductive adhesive or other suitable conductive materials. The electrostatic discharge layer 46 may include PEDOT or other suitable transparent micro-conductive materials. It is worth noting that the fifth dielectric layer 44, the electrostatic discharge layer 46, and the conductive layer 50 in this embodiment may be applied to other embodiments of the present disclosure (such as other embodiments going to be described below) according to some demands.

Figure 13:
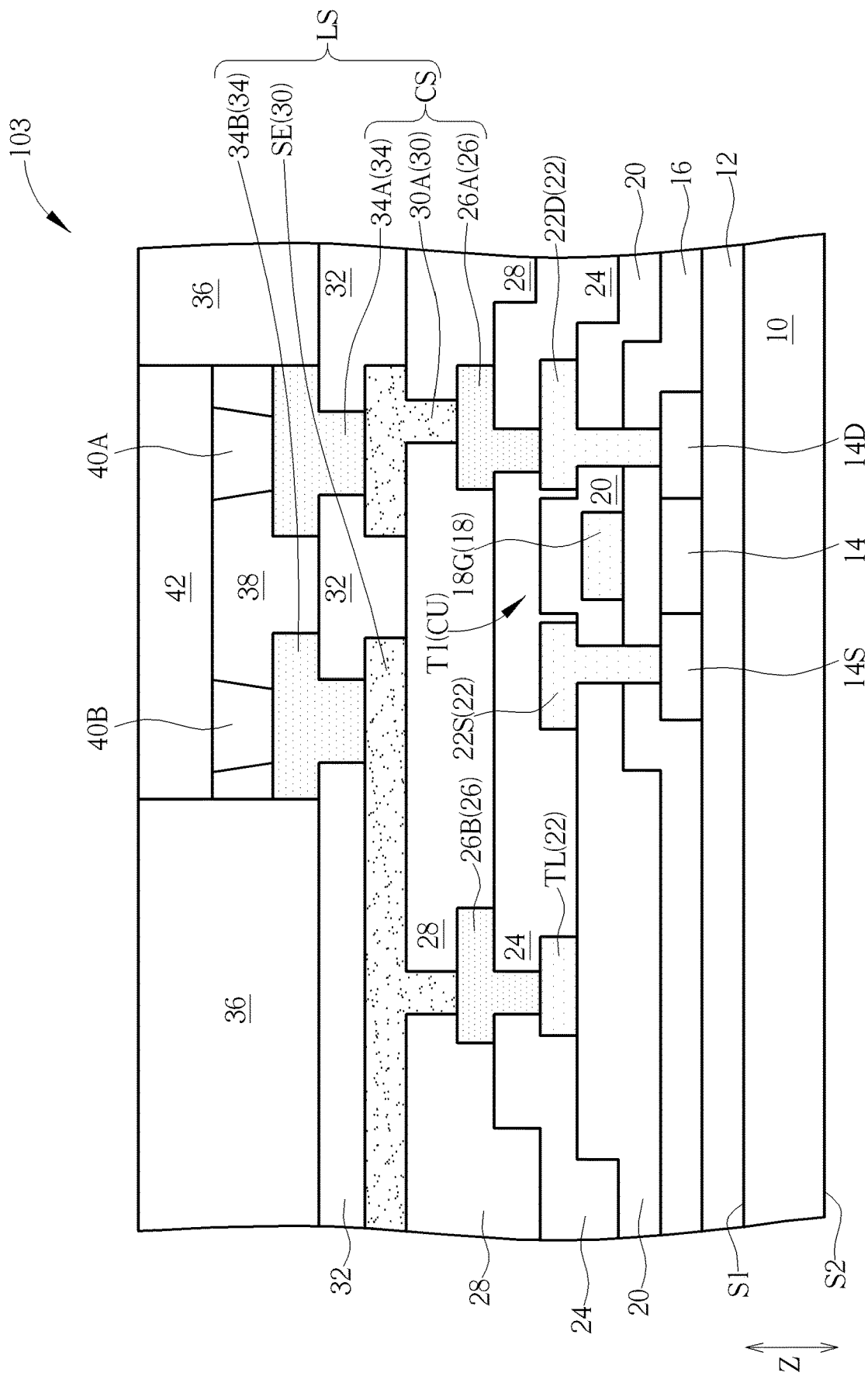
FIG. 13 is a schematic diagram illustrating a partial cross-sectional structure of a touch display device according to a third embodiment of the present disclosure.

Please refer to FIG. 13. FIG. 13 is a schematic diagram illustrating a partial cross-sectional structure of a touch display device 103 according to a third embodiment of the present disclosure. Some structures in this embodiment are similar to those of the first embodiment shown in FIG. 1, and the similar features will not be redundantly described. The difference between some structures in this embodiment and those of the first embodiment shown in FIG. 1 is that the sensing electrode SE in the touch display device 103 may be formed of a portion of the fourth conductive layer 30, and the sensing line TL may be formed of a portion of the second conductive layer 22. In other words, the sensing line TL, the source electrode 22S, and the drain electrode 22D may be formed of an identical layer (such as the second conductive layer 22), and the sensing electrode SE and one layer in the conductive channel CS (such as the first portion 30A of the fourth conductive layer 30) may be formed of an identical layer. In addition, the third conductive layer 26 in this embodiment may further include a second portion 26B disposed between the sensing line TL and the sensing electrode SE for electrically connecting the sensing line TL and the sensing electrode SE. In some embodiments, the sensing line TL may be disposed on the first dielectric layer 20, and the second portion 26B of the third conductive layer 26 may be partly disposed on the second dielectric layer 24 and partly disposed in an opening penetrating the second dielectric layer 24 for being electrically connected with the sensing line TL. The sensing electrode SE may be partly disposed on the planarization layer 28 and partly disposed in an opening penetrating the planarization layer 28 for being electrically connected with the second portion 26B of the third conductive layer 26. In addition, the stacked structure LS may include a second portion 34B of the fifth conductive layer 34 disposed between the sensing electrode SE and the inorganic light emitting unit 42, and the sensing electrode SE may be electrically connected with the inorganic light emitting unit 42 via the second portion 34B of the fifth conductive layer 34. In some embodiments, the second portion 34B of the fifth conductive layer 34 may be partly disposed on the third dielectric layer 32 and partly disposed in an opening penetrating the third dielectric layer 34 for being electrically connected with the sensing electrode SE. In addition, the second portion 34B of the fifth conductive layer 34 may be electrically connected with the second voltage terminal Vss shown in FIG. 6 for applying corresponding signals (such as ground voltage) to the inorganic light emitting unit 42, but not limited thereto.

Figure 14:
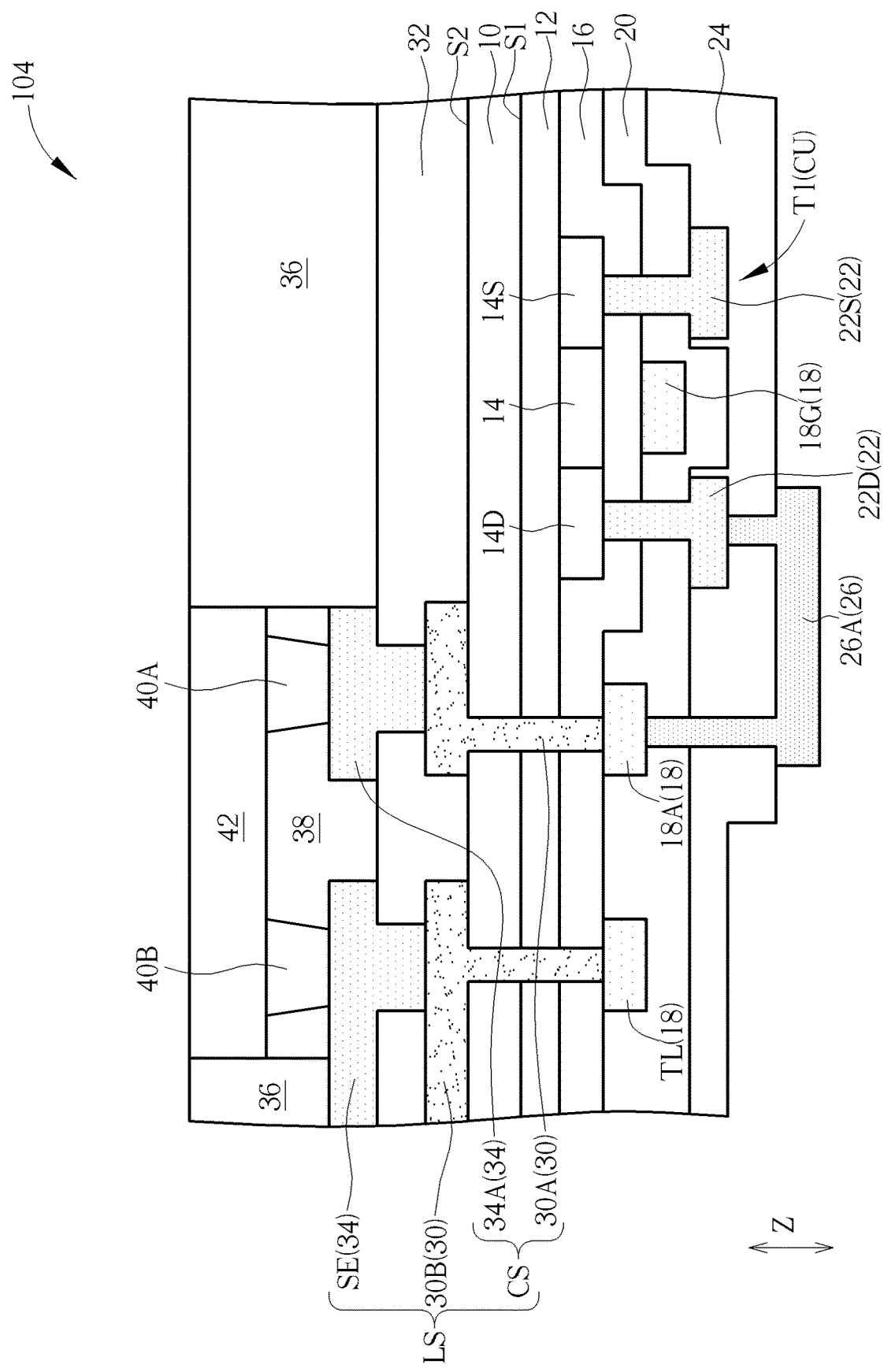
FIG. 14 is a schematic diagram illustrating a partial cross-sectional structure of a touch display device according to a fourth embodiment of the present disclosure.

Please refer to FIG. 14. FIG. 14 is a schematic diagram illustrating a partial cross-sectional structure of a touch display device 104 according to a fourth embodiment of the present disclosure. As shown in FIG. 14, in the touch display device 104, the first conductive layer 18 and at least a part of the stacked structure LS may be may be disposed on and/or near two opposite sides of the substrate 10 (such as the first side S1 and the second side S2) respectively. For example, the buffer layer 12, the semiconductor layer 14, the gate dielectric layer 16, the first conductive layer 18, the first dielectric layer 20, the second conductive layer 22, the second dielectric layer 24, and the third conductive layer 26 described above may be sequentially disposed on and/or near the first side S1 of the substrate 10, the fourth conductive layer 30 described above may be partly disposed on and/or near the first side S1 of the substrate 10 and partly disposed on and/or near the second side S2 of the substrate 10, and the third dielectric layer 32, the fifth conductive layer 34, and the inorganic light emitting unit 42 may be sequentially disposed on and/or near the second side S2 of the substrate 10. The sensing line TL in this embodiment may be formed of a portion of the first conductive layer 18, and the sensing line TL and the gate electrode 18G may be formed of an identical layer (such as the first conductive layer 18) accordingly. In addition, the first conductive layer 18 may further include a first portion 18A disposed on the gate dielectric layer 16. The first portion 18A of the first conductive layer 18 is separated from the gate electrode 18G and the sensing line TL, and the drain electrode 22D of the first transistor T1 may be electrically connected with the first portion 18A of the first conductive layer 18 via the first portion 26A of the third conductive layer 26, but the present embodiment is not limited to this. In some embodiments, the drain electrode 22D of the first transistor T1 may extend to at least partly overlap and be electrically connected with the first portion 18A of the first conductive layer 18, and the first portion 26A of the third conductive layer 26 may be omitted accordingly. In this embodiment, the first portion 30A of the fourth conductive layer 30 may be partly disposed on and/or near the second side S2 of the substrate 10 and partly disposed in an opening penetrating the substrate 10, the buffer layer 12, and the gate dielectric layer 16 for being electrically connected with the first portion 18A of the first conductive layer 18 disposed on and/or near the first side S1 of the substrate 10. Accordingly, the drain electrode 22D of the first transistor T1 may be electrically connected with the inorganic light emitting unit 42 via the first portion 26A of the third conductive layer 26, the first portion 18A of the first conductive layer 18, the conductive channel CS, and the first contact pad 40A.

In addition, the fourth conductive layer 30 in this embodiment may further include a second portion 30B disposed between the sensing line TL and the sensing electrode SE for electrically connecting the sensing line TL and the sensing electrode SE. The second portion 30B of the fourth conductive layer 30 may be partly disposed on and/or near the second side S2 of the substrate 10 and partly disposed in an opening penetrating the substrate 10, the buffer layer 12, and the gate dielectric layer 16 for being electrically connected with the sensing line TL disposed on and/or near the first side S1 of the substrate 10. In this embodiment, the second portion 30B of the fourth conductive layer 30 and/or the sensing electrode SE may be used to be electrically connected with the second voltage terminal Vss shown in FIG. 6 described above, and the inorganic light emitting unit 42 may receive corresponding signals (such as ground voltage) via the sensing electrode SE accordingly, but not limited thereto. Additionally, in some embodiments, a conductive material may be formed in the opening penetrating the substrate 10, the buffer layer 12, and the gate dielectric layer 16 before the step of forming the fourth conductive layer 30 according to some demands, but not limited thereto.

Figure 15:
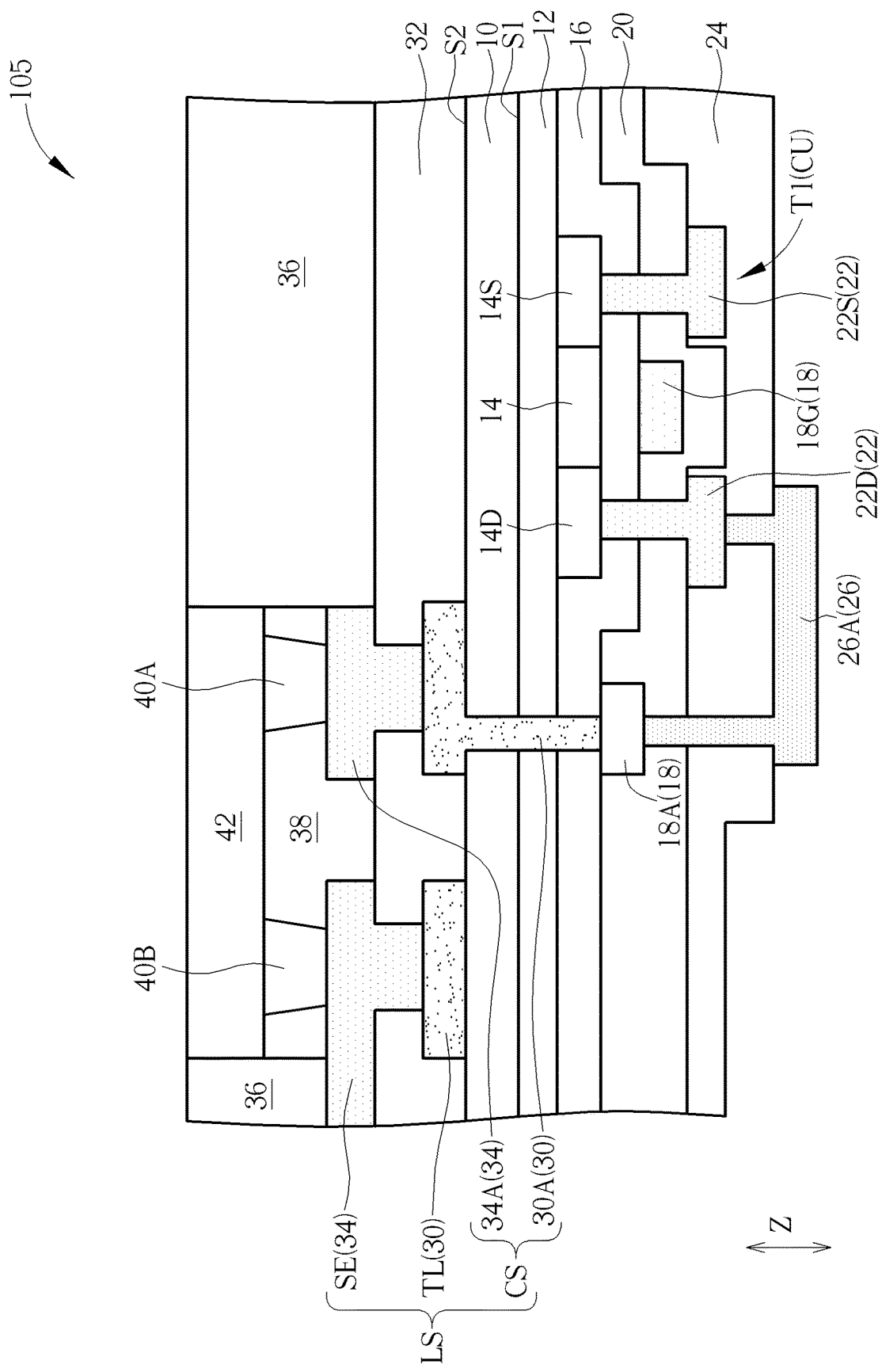
FIG. 15 is a schematic diagram illustrating a partial cross-sectional structure of a touch display device according to a fifth embodiment of the present disclosure.

Please refer to FIG. 15. FIG. 15 is a schematic diagram illustrating a partial cross-sectional structure of a touch display device 105 according to a fifth embodiment of the present disclosure. This embodiment and the fourth embodiment shown in FIG. 14 are partly similar to each other, and the similar features will not be redundantly described. The difference between some structures in this embodiment and those of the fourth embodiment shown in FIG. 14 is that, in the touch display device 105, the sensing line TL may be formed of a portion of the fourth conductive layer 30, and the sensing line TL and the data line (such as a data line formed of a portion of the second conductive layer 22) may be disposed on and/or near different and opposite sides of the substrate 10 respectively. The area required for wirings in the non-display region may be reduced by disposing the sensing line TL and the data line on and/or near different and opposite sides of the substrate 10 respectively, but not limited thereto.

Figure 16:
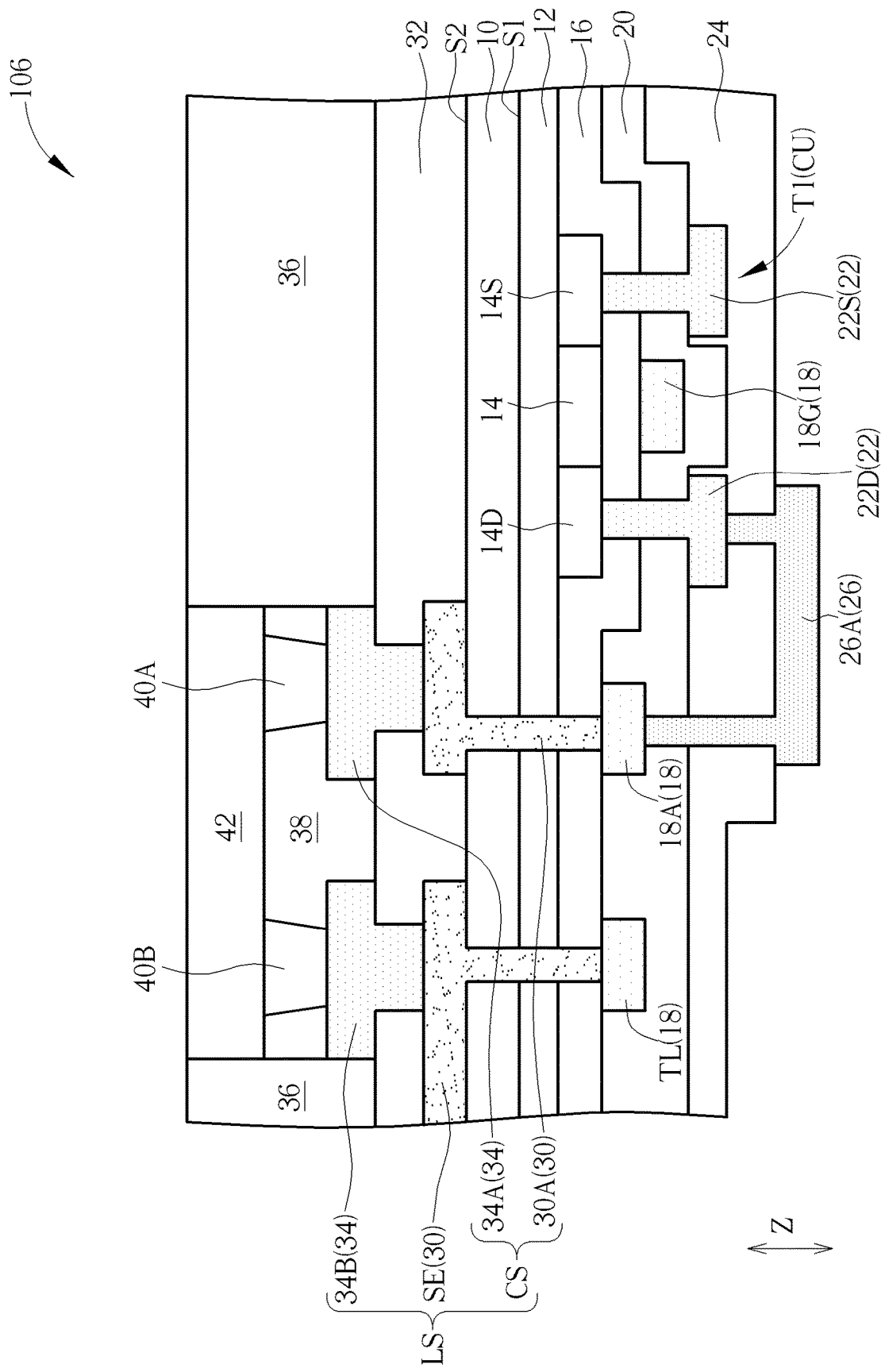
FIG. 16 is a schematic diagram illustrating a partial cross-sectional structure of a touch display device according to a sixth embodiment of the present disclosure.

Please refer to FIG. 16. FIG. 16 is a schematic diagram illustrating a partial cross-sectional structure of a touch display device 106 according to a sixth embodiment of the present disclosure. This embodiment and the fourth embodiment shown in FIG. 14 are partly similar to each other, and the similar features will not be redundantly described. The difference between some structures in this embodiment and those of the fourth embodiment shown in FIG. 14 is that, in the touch display device 106, the sensing electrode SE may be formed of a portion of the fourth conductive layer 30, and the sensing line TL may be formed of a portion of the first conductive layer 18. In other words, the sensing line TL and the gate electrode 18G in this embodiment may be formed of an identical layer (such as the first conductive layer 18), and the sensing electrode SE and a layer of the conductive channel CS (such as the first portion 30A of the fourth conductive layer 30) may be formed of an identical layer. The sensing electrode SE in this embodiment may be partly disposed on and/or near the second side S2 of the substrate 10 and partly disposed in an opening penetrating the substrate 10, the buffer layer 12, and the gate dielectric layer 16 for being electrically connected with the sensing line TL disposed on and/or near the first side S1 of the substrate 10. In this embodiment, the second portion 34B of the fifth conductive layer 34 and/or the sensing electrode SE may be used to be electrically connected with the aforementioned second voltage terminal Vss shown in FIG. 6, and the inorganic light emitting unit 42 may receive corresponding signals (such as ground voltage) via the second portion 34B of the fifth conductive layer 34 accordingly, but not limited thereto.

Figure 17:
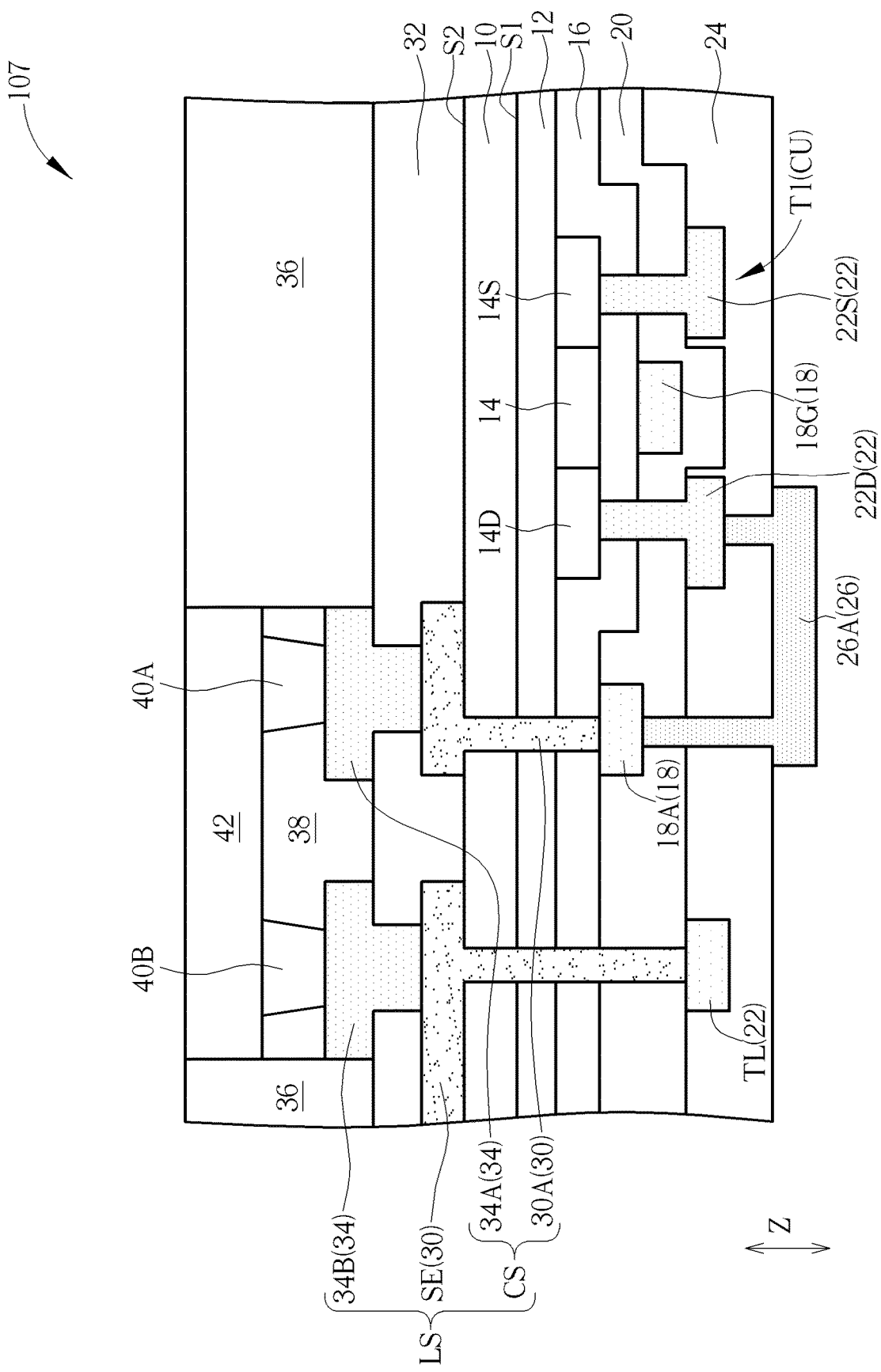
FIG. 17 is a schematic diagram illustrating a partial cross-sectional structure of a touch display device according to a seventh embodiment of the present disclosure.

Please refer to FIG. 17. FIG. 17 is a schematic diagram illustrating a partial cross-sectional structure of a touch display device 107 according to a seventh embodiment of the present disclosure. This embodiment and the fourth embodiment shown in FIG. 14 are partly similar to each other, and the similar features will not be redundantly described. The difference between some structures in this embodiment and those of the fourth embodiment shown in FIG. 14 is that, in the touch display device 107, the sensing electrode SE may be formed of a portion of the fourth conductive layer 30, and the sensing line TL may be formed of a portion of the second conductive layer 22. In other words, the sensing line TL, the source electrode 22S, and the drain electrode 22D in this embodiment may be formed of an identical layer (such as the second conductive layer 22), and the sensing electrode SE and a layer of the conductive channel CS (such as the first portion 30A of the fourth conductive layer 30) may be formed of an identical layer. The sensing electrode SE in this embodiment may be partly disposed on and/or near the second side S2 of the substrate 10 and partly disposed in an opening penetrating the substrate 10, the buffer layer 12, the gate dielectric layer 16, and the first dielectric layer 20 for being electrically connected with the sensing line TL disposed on and/or near the first side S1 of the substrate 10. Additionally, in some embodiments, a conductive material with better gap-filling capability may be formed in the opening penetrating the substrate 10, the buffer layer 12, the gate dielectric layer 16, and the first dielectric layer 20 before the step of forming the fourth conductive layer 30 according to some demands, and the manufacturing yield of the fourth conductive layer 30 is accordingly less influenced by the extremely high aspect ratio of the opening penetrating the substrate 10, the buffer layer 12, the gate dielectric layer 16, and the first dielectric layer 20, but this disclosure is not limited thereto.

Figure 18:
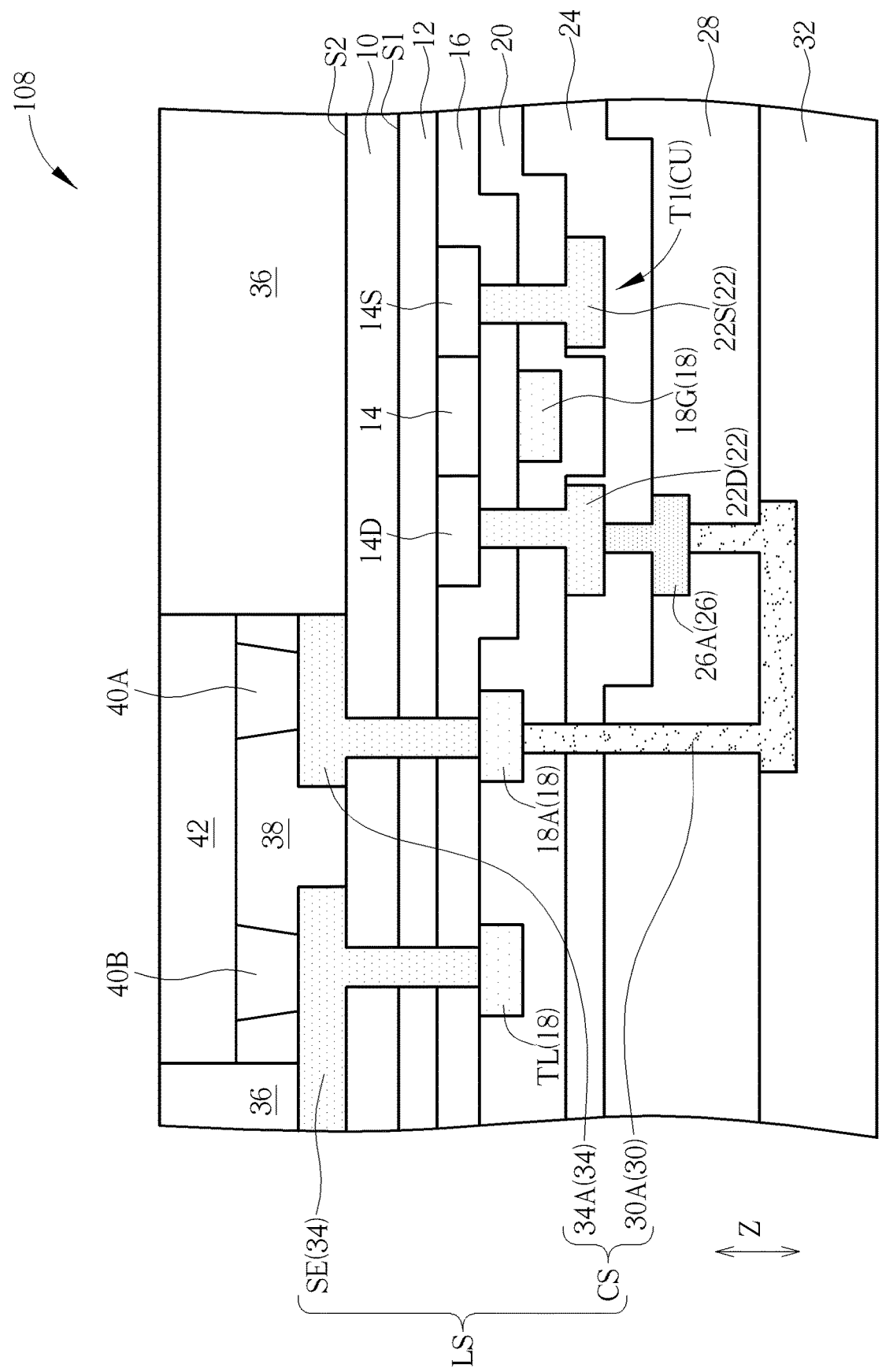
FIG. 18 is a schematic diagram illustrating a partial cross-sectional structure of a touch display device according to an eighth embodiment of the present disclosure.

Please refer to FIG. 18. FIG. 18 is a schematic diagram illustrating a partial cross-sectional structure of a touch display device 108 according to an eighth embodiment of the present disclosure. This embodiment and the fourth embodiment shown in FIG. 14 are partly similar to each other, and the similar features will not be redundantly described. The difference between some structures in this embodiment and those of the fourth embodiment shown in FIG. 14 is that, in the touch display device 108, the planarization layer 28, the fourth conductive layer 30, and the third dielectric layer 32 may be disposed on and/or near the first side S1 of the substrate 10, and the fifth conductive layer 34 and the inorganic light emitting unit 42 may be disposed on and/or near the second side S2 of the substrate 10. In other words, the stacked structure LS may be partly disposed on and/or near the first side S1 of the substrate 10 and partly disposed on and/or near the second side S2 of the substrate 10. The sensing electrode SE in this embodiment may be formed of a portion of the fifth conductive layer 34, and the sensing line TL may be formed of a portion of the first conductive layer 18. The first portion 34A of the fifth conductive layer 34 may be disposed on and/or near the second side S2 of the substrate 10 and partly disposed in an opening penetrating the substrate 10, the buffer layer 12, and the gate dielectric layer 16 for being electrically connected with the first portion 18A of the first conductive layer 18 disposed on and/or near the first side S1 of the substrate 10. The sensing electrode SE may be partly disposed on and/or near the second side S2 of the substrate 10 and partly disposed in an opening penetrating the substrate 10, the buffer layer 12, and the gate dielectric layer 16 for being electrically connected with the sensing line TL disposed on and/or near the first side S1 of the substrate 10. In addition, the first portion 30A of the fourth conductive layer 30 in this embodiment may be partly disposed on the planarization layer 28, partly disposed in an opening penetrating the planarization layer 28, and partly disposed in an opening penetrating the planarization layer 28, the second dielectric layer 24, and the first dielectric layer 20 for electrically connecting the first portion 26A of the third conductive layer 26 and the first portion 18A of the first conductive layer 18. In addition, the first portion 18A of the first conductive layer 18 in this embodiment may be located between the first portion 34A of the fifth conductive layer 34 and the first portion 30A of the fourth conductive layer 30, and the drain electrode 22D may be electrically connected with the inorganic light emitting unit 42 via the first portion 26A of the third conductive layer 26, the first portion 30A of the fourth conductive layer 30, the first portion 18A of the first conductive layer 18, the first portion 34A of the fifth conductive layer 34, and the first contact pad 40A accordingly, but not limited thereto. In some embodiments, the drain electrode 22D of the first transistor T1 may extend to at least partly overlap and be electrically connected with the first portion 18A of the first conductive layer 18, and the first portion 26A of the third conductive layer 26 and the first portion 30A of the fourth conductive layer 30 may be omitted accordingly. In some embodiments, the first portion 26A of the third conductive layer 26 may extend to at least partly overlap and be electrically connected with the first portion 18A of the first conductive layer 18, and the first portion 30A of the fourth conductive layer 30 may be omitted accordingly.

Figure 19:
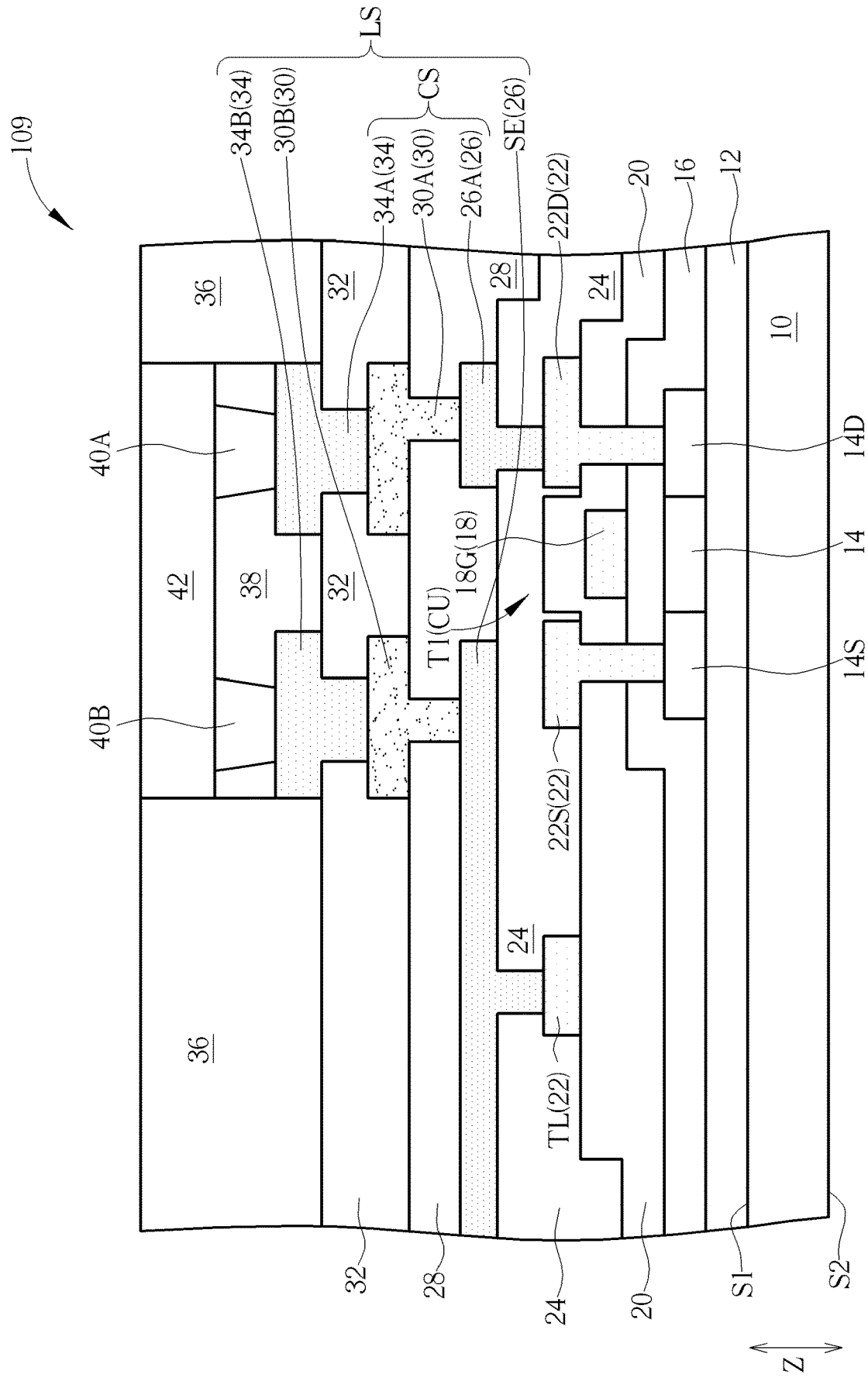
FIG. 19 is a schematic diagram illustrating a partial cross-sectional structure of a touch display device according to a ninth embodiment of the present disclosure.

Please refer to FIG. 19. FIG. 19 is a schematic diagram illustrating a partial cross-sectional structure of a touch display device 109 according to a ninth embodiment of the present disclosure. This embodiment and the third embodiment shown in FIG. 13 are partly similar to each other, and the similar features will not be redundantly described. The difference between some structures in this embodiment and those of the third embodiment shown in FIG. 13 is that, in the touch display device 109, the sensing electrode SE may be formed of a portion of the third conductive layer 26, and the sensing line TL may be formed of a portion of the second conductive layer 22. In addition, the second portion 30B of the fourth conductive layer 30 may be disposed on the sensing electrode SE, the second portion 34B of the fifth conductive layer 34 may be disposed on the second portion 30B of the fourth conductive layer 30, and the sensing electrode SE may be electrically connected with the inorganic light emitting unit 42 via the second portion 30B of the fourth conductive layer 30, the second portion 34B of the fifth conductive layer 34, and the second contact pad 40B. In addition, the sensing electrode SE in this embodiment may be partly disposed on the second dielectric layer 24 and partly disposed in an opening penetrating the second dielectric layer 24 for being electrically connected with the sensing line TL disposed on the first dielectric layer 20. In this embodiment, the second portion 34B of the fifth conductive layer 34 and/or the second portion 30B of the fourth conductive layer 30 may be used to be electrically connected with the aforementioned second voltage terminal Vss shown in FIG. 6, and the inorganic light emitting unit 42 may receive corresponding signals (such as ground voltage) via the second portion 34B of the fifth conductive layer 34 accordingly, but not limited thereto.

It is worth noting that, in the embodiments (such as the embodiments described above) where the sensing electrode SE is electrically connected with the inorganic light emitting unit 42, the inorganic light emitting unit 42 may be electrically connected with the second voltage terminal Vss shown in FIG. 6 described above via the sensing electrode SE, a portion of the fifth conductive layer 34 and/or a portion of the fourth conductive layer 30, and the inorganic light emitting unit 42 may receive corresponding signals (such as ground voltage) accordingly, but not limited thereto.

Figure 20:
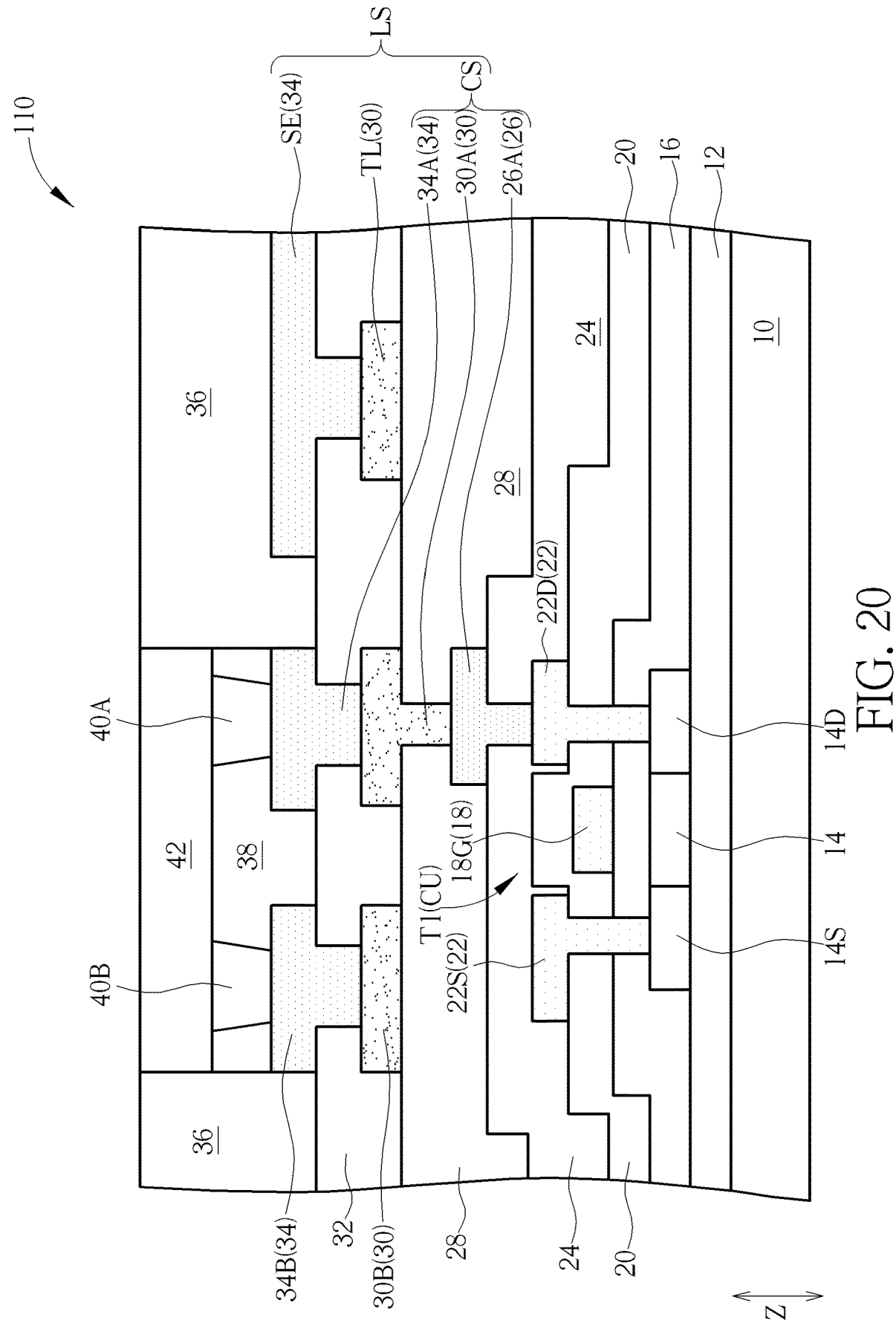
FIG. 20 is a schematic diagram illustrating a partial cross-sectional structure of a touch display device according to a tenth embodiment of the present disclosure.

Please refer to FIG. 20. FIG. 20 is a schematic diagram illustrating a partial cross-sectional structure of a touch display device 110 according to a tenth embodiment of the present disclosure. This embodiment and the first embodiment shown in FIG. 1 are partly similar to each other, and the similar features will not be redundantly described. The difference between some structures in this embodiment and those of the first embodiment shown in FIG. 1 is that, in the touch display device 110, the sensing electrode SE may be formed of a portion of the fifth conductive layer 34, the sensing line TL may be formed of a portion of the fourth conductive layer 30, and the sensing electrode SE may not be electrically connected with the inorganic light emitting unit 42. In addition, the second portion 34B of the fifth conductive layer 34 and the second portion 30B of the fourth conductive layer 30 electrically connected with the inorganic light emitting unit 42 may be electrically separated from the sensing electrode SE, and the touch sensing operation and the display operation of the touch display device 110 may not be performed by a time-division approach, but not limited thereto. Additionally, in some embodiments which are not shown in the figures, in the condition that the sensing electrode SE is not electrically connected with the inorganic light emitting unit 42, the sensing electrode SE may be formed of a portion of the fourth conductive layer 30, the sensing line TL may be formed of a portion of the second conductive layer 22, and the second portion of the third dielectric layer 26 may be disposed between the sensing line TL and the sensing electrode SE for electrically connecting the sensing line TL and the sensing electrode SE (such as the condition shown in FIG. 13). Additionally, in some embodiments, in the condition that the sensing electrode SE is not electrically connected with the inorganic light emitting unit 42, the sensing electrode SE may be formed of a portion of the third conductive layer 26, the sensing line TL may be formed of a portion of the second conductive layer 22 (such as the condition shown in FIG. 19 described above), but the second portion 34B of the fifth conductive layer 34 electrically connected with the inorganic light emitting unit 42 and the second portion 30B of the fourth conductive layer 30 electrically connected with the inorganic light emitting unit 42 may be electrically separated from the sensing electrode SE and the sensing line TL.

Figure 21:
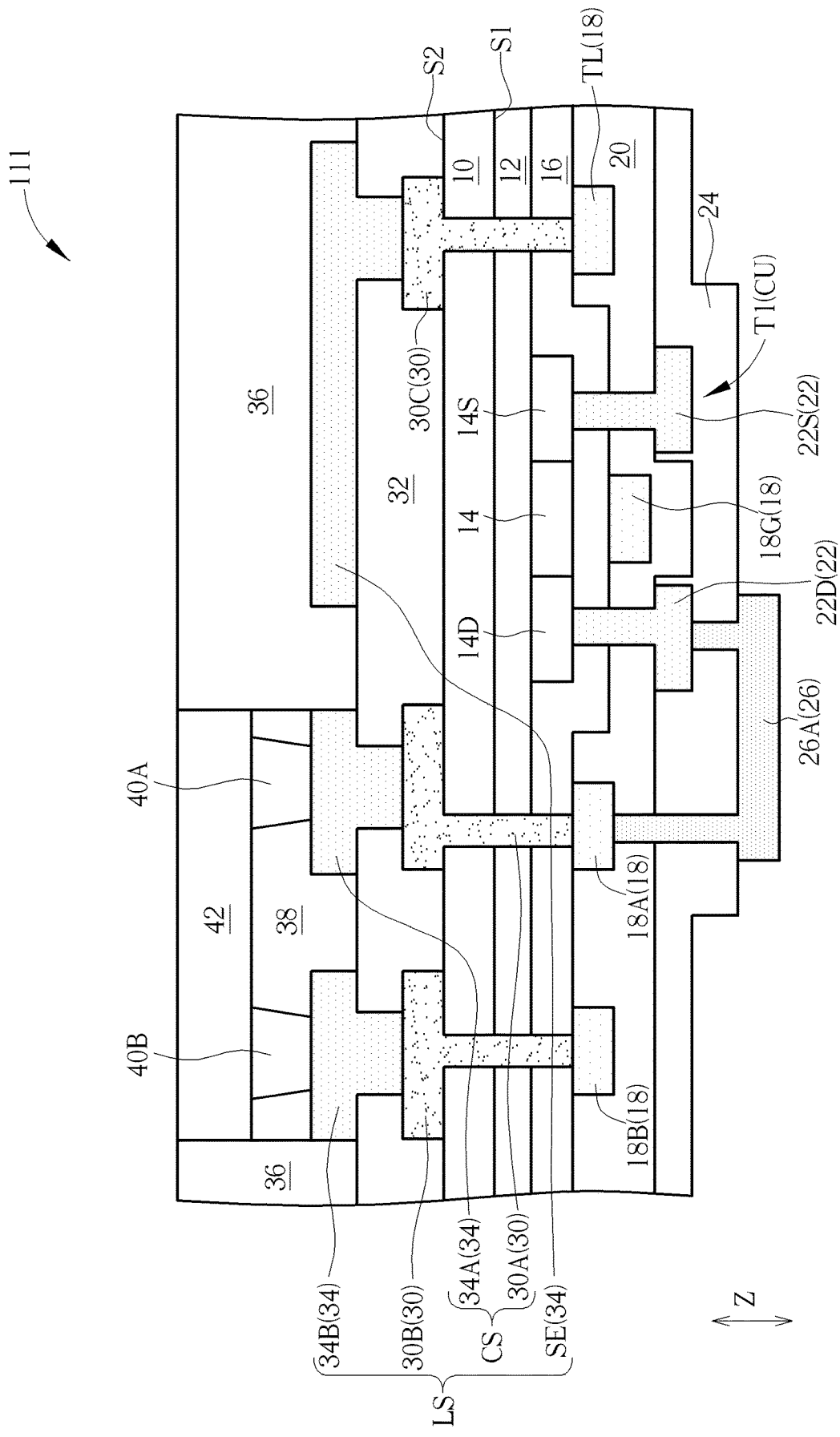
FIG. 21 is a schematic diagram illustrating a partial cross-sectional structure of a touch display device according to an eleventh embodiment of the present disclosure.

Please refer to FIG. 21. FIG. 21 is a schematic diagram illustrating a partial cross-sectional structure of a touch display device 111 according to an eleventh embodiment of the present disclosure. This embodiment and the fourth embodiment shown in FIG. 14 are partly similar to each other, and the similar features will not be redundantly described. The difference between some structures in this embodiment and those of the fourth embodiment shown in FIG. 14 is that, in the touch display device 111, the sensing line TL may be formed of a portion of the first conductive layer 18, the sensing electrode SE may be formed of a portion of the fifth conductive layer 34, and the sensing electrode SE may not be electrically connected with the inorganic light emitting unit 42. In additional, the fourth conductive layer 30 may further include a third portion 30C disposed between the sensing line TL and the sensing electrode SE for electrically connecting the sensing line TL and the sensing electrode SE. In some embodiments, the first conducive layer 18 may further include a second portion 18B electrically separated from the first portion 18A of the first conductive layer 18 and the sensing line TL, and the second portion 18B of the first conductive layer 18 may be electrically connected with the inorganic light emitting unit 42 via the second portion 30B of the fourth conductive layer 30, the second portion 34B of the fifth conductive layer 34, and the second contact pad 40B, but not limited thereto. In this embodiment, the second portion 18B of the first conductive layer 18, the second portion 30 of the fourth conductive layer 30, and/or the second portion 34B of the fifth conductive layer 34 may be used to be electrically connected with the second voltage terminal Vss shown in FIG. 6 described above, and the inorganic light emitting unit 42 may receive corresponding signals (such as ground voltage) accordingly, but not limited thereto.

In some embodiments which are not shown in the figures, in the condition that the sensing electrode SE is not electrically connected with the inorganic light emitting unit 42, the sensing electrode SE may be formed of a portion of the fifth conductive layer 34, and the sensing line TL may be formed of a portion of the fourth conductive layer 30 (such as the condition shown in FIG. 20 described above). In some embodiments, in the condition that the sensing electrode SE is not electrically connected with the inorganic light emitting unit 42 and the condition that the first transistor T1 and the inorganic light emitting unit 42 are disposed on and/or near different and opposite sides of the substrate 10 respectively, the sensing electrode SE may be formed of a portion of the fourth conductive layer 30, and the sensing line TL may be formed of a portion of the first conductive layer 18 (such as the condition shown in FIG. 16). In some embodiments, in the condition that the sensing electrode SE is not electrically connected with the inorganic light emitting unit 42 and the condition that the first transistor T1 and the inorganic light emitting unit 42 are disposed on and/or near different and opposite sides of the substrate 10 respectively, the sensing electrode SE may be formed of a portion of the fourth conductive layer 30, and the sensing line TL may be formed of a portion of the second conductive layer 22 (such as the condition shown in FIG. 17 described above).

Figure 22:
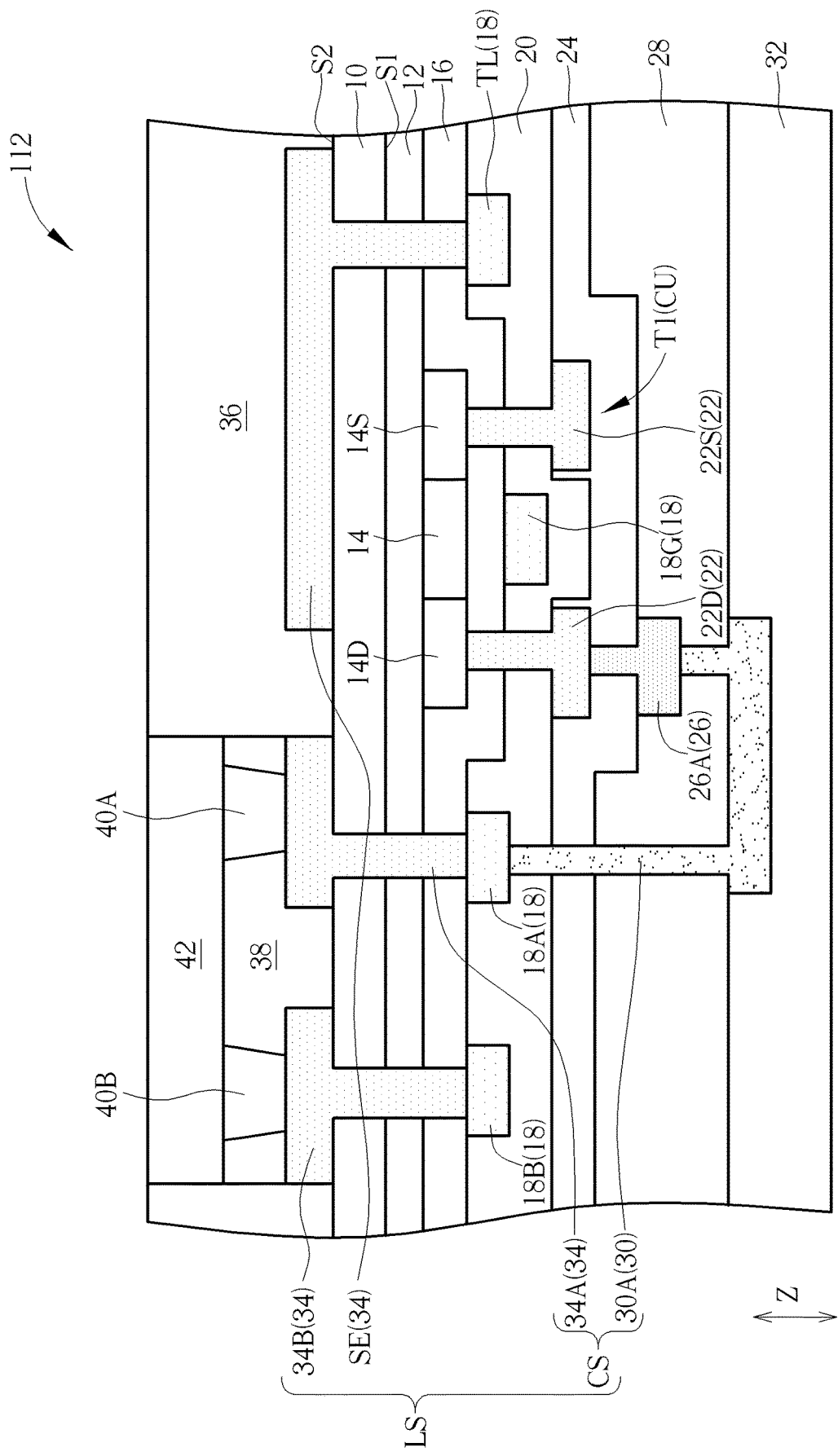
FIG. 22 is a schematic diagram illustrating a partial cross-sectional structure of a touch display device according to a twelfth embodiment of the present disclosure.

Please refer to FIG. 22. FIG. 22 is a schematic diagram illustrating a partial cross-sectional structure of a touch display device 112 according to a twelfth embodiment of the present disclosure. As shown in FIG. 22, in the touch display device 112, the buffer layer 12, the semiconductor layer 14, the gate dielectric layer 16, the first conductive layer 18, the first dielectric layer 20, the second conductive layer 22, the second dielectric layer 24, and the third conductive layer 26, the planarization layer 28, the fourth conductive layer 30, and the third dielectric layer 32 may be sequentially disposed on and/or near the first side S1 of the substrate 10, and the fifth conductive layer 34 and the inorganic light emitting unit 42 may be sequentially disposed on and/or near the second side S2 of the substrate 10. In other words, the stacked structure LS may be partly disposed on and/or near the first side S1 of the substrate 10 and partly disposed on and/or near the second side S2 of the substrate 10. The sensing electrode SE in this embodiment may be formed of a portion of the fifth conductive layer 34, the sensing line TL may be formed of a portion of the first conductive layer 18, and the sensing electrode SE may not be electrically connected with the inorganic light emitting unit 42. In some embodiments, the second portion 18B of the first conductive layer 18 may be electrically connected with the second portion 34B of the fifth conductive layer 34 directly, and the second portion 18 of the first conductive layer 18 and/or the second portion 34B of the fifth conductive layer 34 may be used to be electrically connected with the second voltage terminal Vss shown in FIG. 6 described above, and the inorganic light emitting unit 42 may receive corresponding signals (such as ground voltage) accordingly, but not limited thereto.

To summarize the above descriptions, the sensing electrode and the sensing line with touch sensing functions may be integrated into the inorganic light emitting display device, and the purposes of thickness reduction, process integration, and/or production cost reduction may be achieved accordingly. In addition, the sensing electrode may be electrically connected with or electrically separated from the inorganic light emitting unit according to some demands, and suitable driving approaches may be applied to improve the performances of the touch sensing operation and/or the display operation of the touch display device.

Although the embodiments and advantages thereof in the present disclosure have been disclosed as above, it should be understood that anyone with ordinary knowledge in the related technical field can make changes, substitutions, and decorations without departing from the spirit and the scope of this disclosure. Additionally, the scope of the protected range of this disclosure is not limited to the processes, machines, manufacturing, material compositions, devices, methods, and steps in the specific embodiments described in the description. Any person with ordinary knowledge in the related technical field may understand the current or future development of processes, machines, manufacturing, material composition, devices, methods and steps from the disclosed contents in this disclosure, as long as the substantially same functions carried out in the described embodiments or the substantially same results obtained in the described embodiments may be used in accordance with the present disclosure. Therefore, the protection scope of the present disclosure includes the above-mentioned processes, machines, manufacturing, material composition, devices, methods and steps. Additionally, each claim constitutes a separate embodiment, and the protection scope of the present disclosure also includes a combination of the claims and the embodiments. The protection scope of the present disclosure shall be determined by the scope of the claims listed below.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A touch display device, comprising:
   a substrate;
   a first conductive layer disposed on the substrate, wherein the first conductive layer comprises a gate electrode;
   a second conductive layer disposed on the first conductive layer, wherein the second conductive layer comprises a source electrode and a drain electrode;
   a stacked structure disposed on the substrate, wherein the staked structure comprises a conductive channel and a sensing electrode;
   an inorganic light emitting unit disposed on the stacked structure, wherein the inorganic light emitting unit is electrically connected with the drain electrode via the conductive channel;
   a touch sensing circuit electrically connected with the sensing electrode, wherein the sensing electrode is electrically connected with the inorganic light emitting unit; and
   a contact pad disposed between the inorganic light emitting unit and the sensing electrode, wherein the sensing electrode is electrically connected with the inorganic light emitting unit via the contact pad.

2. The touch display device according to claim 1, wherein the conductive channel comprises a first layer and a second layer, the second layer is disposed on the first layer, and the sensing electrode and one of the first layer or the second layer are formed of an identical layer.

* * * * *